United States Patent
Mokhlesi

(10) Patent No.: US 7,616,495 B2
(45) Date of Patent: Nov. 10, 2009

(54) NON-VOLATILE STORAGE APPARATUS WITH VARIABLE INITIAL PROGRAM VOLTAGE MAGNITUDE

(75) Inventor: Nima Mokhlesi, Los Gatos, CA (US)

(73) Assignee: SanDisk Corporation, Milpitas, CA (US)

( * ) Notice: Subject to any disclaimer, the term of this patent is extended or adjusted under 35 U.S.C. 154(b) by 261 days.

(21) Appl. No.: 11/694,991

(22) Filed: Mar. 31, 2007

(65) Prior Publication Data

US 2008/0198661 A1    Aug. 21, 2008

Related U.S. Application Data

(60) Provisional application No. 60/890,832, filed on Feb. 20, 2007.

(51) Int. Cl.
G11C 11/34 (2006.01)
(52) U.S. Cl. .............................. 365/185.19; 365/185.03
(58) Field of Classification Search ............ 365/185.19, 365/185.03
See application file for complete search history.

(56) References Cited

U.S. PATENT DOCUMENTS

| | | |
|---|---|---|
| 4,357,685 A | 11/1982 | Daniele |
| 5,132,935 A | 7/1992 | Ashmore |
| 5,270,979 A | 12/1993 | Harari |
| 5,295,107 A | 3/1994 | Okazawa |
| 5,576,992 A | 11/1996 | Mehrad |
| 5,680,350 A | 10/1997 | Lee |
| 5,812,457 A | 9/1998 | Arase |
| 5,909,387 A | 6/1999 | Wong |
| 5,920,507 A | 7/1999 | Takeuchi |
| 5,930,174 A | 7/1999 | Chen |
| 6,031,766 A | 2/2000 | Chen |
| 6,137,729 A | 10/2000 | Choi |
| 6,172,909 B1 | 1/2001 | Haddad |
| 6,243,290 B1 | 6/2001 | Kurata |
| 6,252,803 B1 | 6/2001 | Fastow |
| 6,288,938 B1 | 9/2001 | Park |
| 6,438,037 B1 | 8/2002 | Fastow |
| 6,522,580 B2 | 2/2003 | Chen |
| 6,522,585 B2 | 2/2003 | Pasternak |
| 6,587,903 B2 | 7/2003 | Roohparvar |
| 6,590,811 B1 | 7/2003 | Hamilton |

(Continued)

OTHER PUBLICATIONS

U.S. Appl. No. 11/377,972, filed Mar. 17, 2006, System for Performing Read Operation on Non-Volatile Storage With Compensation for Coupling, by Mokhlesi.

(Continued)

*Primary Examiner*—Son Dinh
*Assistant Examiner*—Nam Nguyen
(74) *Attorney, Agent, or Firm*—Vierra Magen Marcus & DeNiro LLP

(57) ABSTRACT

Multiple programming processes are performed for a plurality of non-volatile storage elements. Each of the programming process operates to program at least a subset of said non-volatile storage elements to a set of target conditions using program pulses. In one embodiment, a first programming pass includes soft programming and additional programming passes include the programming of data. In another embodiment, all of the programming process include programming data. For at least a subset of said programming processes, a program pulse associated with achieving a particular result for a respective programming process is identified. The identified program pulse is used to adjust programming for a subsequent programming process.

22 Claims, 17 Drawing Sheets

U.S. PATENT DOCUMENTS

| | | | |
|---|---|---|---|
| 6,639,844 | B1 | 10/2003 | Liu |
| 6,654,287 | B2 | 11/2003 | Visconti |
| 6,657,891 | B1 | 12/2003 | Shibata |
| 6,661,711 | B2 | 12/2003 | Pan |
| 6,684,173 | B2 | 1/2004 | Kessenich |
| 6,711,056 | B2 | 3/2004 | Abedifard |
| 6,714,459 | B2 | 3/2004 | Hirano |
| 6,735,114 | B1 | 5/2004 | Hamilton |
| 6,735,116 | B2 | 5/2004 | Lee |
| 6,744,670 | B2 | 6/2004 | Tamada |
| 6,798,698 | B2 | 9/2004 | Tanaka |
| 6,925,004 | B2 | 8/2005 | Shibata |
| 7,016,226 | B2 | 3/2006 | Shibata |
| 7,023,737 | B1 | 4/2006 | Wan et al. |
| 7,073,103 | B2 | 7/2006 | Gongwer |
| 7,092,290 | B2 | 8/2006 | Hemink |
| 7,139,198 | B2 | 11/2006 | Guterman |
| 7,173,859 | B2 | 2/2007 | Hemink |
| 7,177,199 | B2 | 2/2007 | Chen |
| 7,196,928 | B2 | 3/2007 | Chen |
| 7,254,071 | B2 | 8/2007 | Tu |
| 7,289,365 | B2 | 10/2007 | Shuto |
| 7,450,426 | B2 * | 11/2008 | Li et al. ............. 365/185.19 |
| 7,551,482 | B2 | 6/2009 | Kamei |
| 2002/0186594 | A1 | 12/2002 | Visconti |
| 2002/0191444 | A1 | 12/2002 | Gregori |
| 2004/0109362 | A1 | 6/2004 | Gongwer |
| 2005/0162916 | A1 | 7/2005 | Guterman |
| 2006/0140011 | A1 | 6/2006 | Fong |
| 2006/0274583 | A1 | 12/2006 | Lutze |
| 2007/0159888 | A1 | 7/2007 | Tu |
| 2007/0159891 | A1 | 7/2007 | Tu |
| 2007/0253248 | A1 | 11/2007 | Maayan |
| 2008/0158980 | A1 | 7/2008 | Kamei |
| 2008/0198660 | A1 | 8/2008 | Nygren |
| 2008/0198662 | A1 | 8/2008 | Mokhlesi |
| 2008/0198664 | A1 | 8/2008 | Mokhlesi |
| 2008/0198665 | A1 | 8/2008 | Mokhlesi |

OTHER PUBLICATIONS

U.S. Appl. No. 11/548,264, filed Oct. 10, 2006, Variable Program Voltage Increment Values in Non-Volatile Memory Program Operations, by Li.

U.S. Appl. No. 11/616,647, filed Dec. 27, 2006, Method for Programming With Initial Programming Voltage Based on Trial, by Kamei.

International Search Report, dated Jun. 16, 2008, PCT Appl. No. PCT/US2008/053858, filed Feb. 13, 2008.

Written Opinion of the International Security Authority, dated Jun. 16, 2008, PCT Appl. No. PCT/US2008/053858, filed Feb. 13, 2008.

U.S. Appl. No. 11/694,990, filed Mar. 31, 2007.

Notice of Allowance, dated Mar. 31, 2009, U.S. Appl. No. 11/694,987, filed Mar. 31, 2007.

Notice of Allowance, dated Mar. 23, 2009, U.S. Appl. No. 11/694,990, filed Mar. 31, 2007.

Office Action, dated Apr. 16, 2009, U.S. Appl. No. 11/694,992, filed Mar. 31, 2007.

Office Action, dated Apr. 2, 2009, U.S. Appl. No. 12/018,275, filed Jan. 23, 2008.

Response to Office Action, dated May 11, 2009, U.S. Appl. No. 12/018,275, filed Jan. 23, 2008.

Office Action, dated Mar. 6, 2009, U.S. Appl. No. 12/018,279, filed Jan. 23, 2008.

Response to Office Action, dated May 11, 2009, U.S. Appl. No. 12/018,279, filed Jan. 23, 2008.

Notice of Allowance, dated Feb. 17, 2009, U.S. Appl. No. 11/694,987, filed Mar. 31, 2007.

Notice of Allowance, dated Feb. 26, 2009, U.S. Appl. No. 11/694,989, filed Mar. 31, 2007.

Office Action dated Jun. 23, 2008, U.S .Appl. No. 11/616,647, filed Dec. 27, 2006.

Response to Office Action dated Sep. 26, 2008, U.S. Appl. No. 11/616,647, filed Dec. 27, 2006.

Office Action dated Nov. 20, 2008, U.S. Appl. No. 11/616,647, filed Dec. 27, 2006.

Response to Office Action dated Feb. 12, 2008, U.S. Appl. No. 11/616,647, filed Dec. 27, 2006.

Office Action dated Jun. 26, 2008, U.S. Appl. No. 11/616,665, filed Dec. 27, 2006.

Response to Office Action dated Sep. 26. 2008, U.S. Appl. No. 11/616,665, filed Dec. 27, 2006.

Office Action dated Nov. 18, 2008, U.S. Appl. No. 11/616,665, filed Dec. 27, 2006.

Response to Office Action dated Feb. 12, 2009, U.S. Appl. No. 11/616,665, filed Dec. 27, 2006.

Notice of Allowance dated Apr. 3, 2009, U.S. Appl. No. 11/616,665, filed Dec. 27, 2006.

U.S. Appl. No. 12/493,040, filed Jun. 26, 2009.

Preliminary Amendment dated Jul. 28, 2009, U.S. Appl. No. 12/493,040, filed Jun. 26, 2009.

Response to Office Action filed Jul. 7, 2009, U.S. Appl. No. 11/694,992.

* cited by examiner

Fig. 8

| state | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 4th Top Page | 1 | 0 | 1 | 0 | 1 | 0 | 1 | 0 | 1 | 0 | 1 | 0 | 1 | 0 | 1 | 0 |
| 3rd Higher Page | 1 | 1 | 0 | 0 | 1 | 1 | 0 | 0 | 1 | 1 | 0 | 0 | 1 | 1 | 0 | 0 |
| 2nd Upper Page | 1 | 1 | 1 | 1 | 0 | 0 | 0 | 0 | 1 | 1 | 1 | 1 | 0 | 0 | 0 | 0 |
| 1st Lower Page | 1 | 1 | 1 | 1 | 1 | 1 | 1 | 1 | 0 | 0 | 0 | 0 | 0 | 0 | 0 | 0 |

Fig. 9

| state | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 4th Top Page | 1 | 0 | 0 | 1 | 1 | 0 | 0 | 1 | 1 | 0 | 0 | 1 | 1 | 0 | 0 | 1 |
| 3rd Higher Page | 1 | 1 | 0 | 0 | 0 | 0 | 1 | 1 | 1 | 1 | 0 | 0 | 0 | 0 | 1 | 1 |
| 2nd Upper Page | 1 | 1 | 1 | 1 | 0 | 0 | 0 | 0 | 0 | 0 | 0 | 0 | 1 | 1 | 1 | 1 |
| 1st Lower Page | 1 | 1 | 1 | 1 | 1 | 1 | 1 | 1 | 0 | 0 | 0 | 0 | 0 | 0 | 0 | 0 |

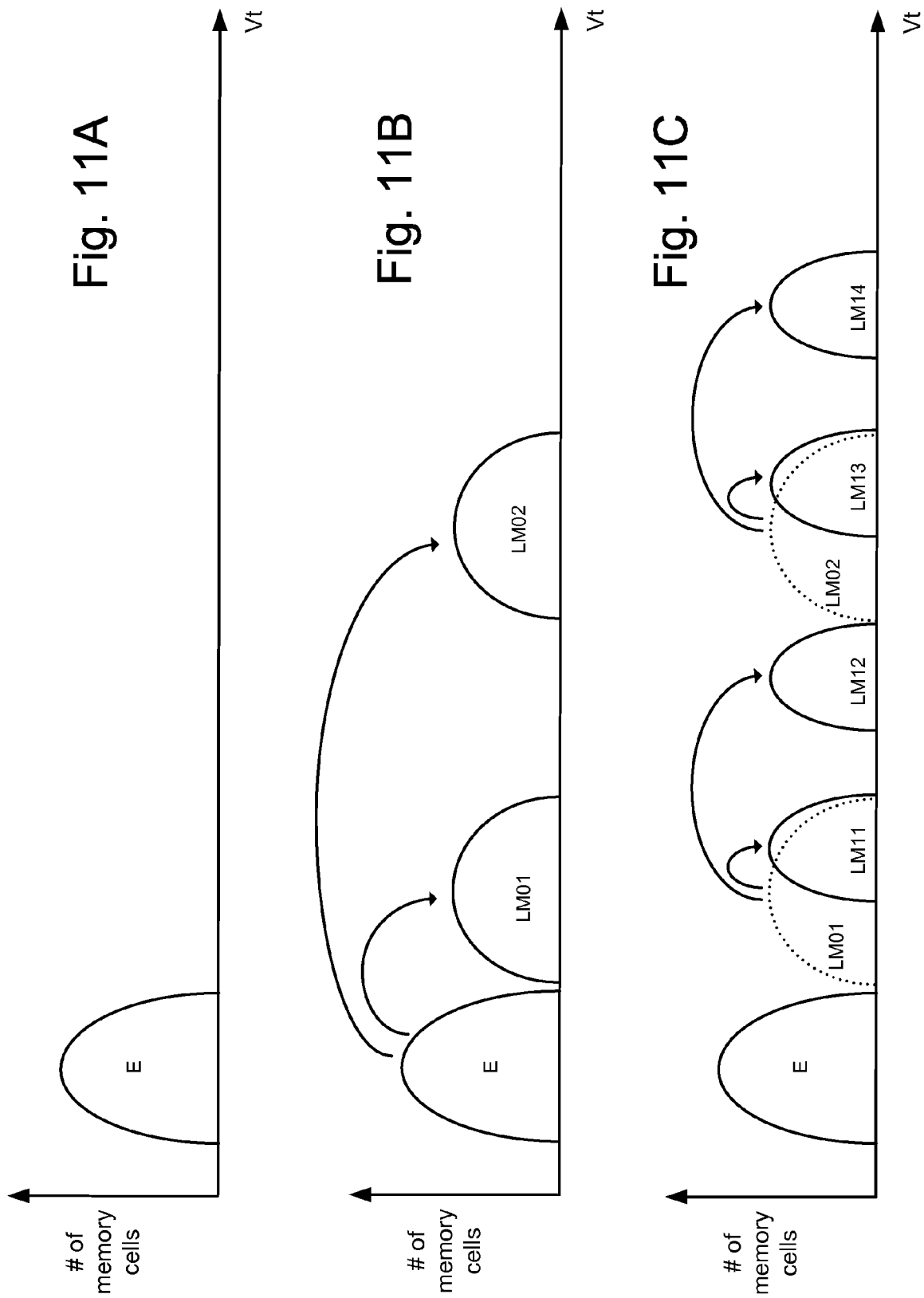

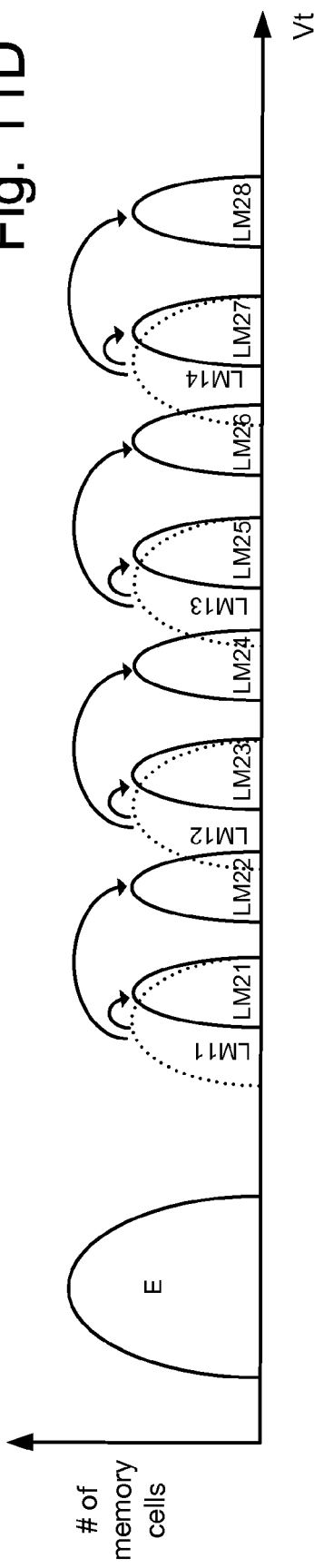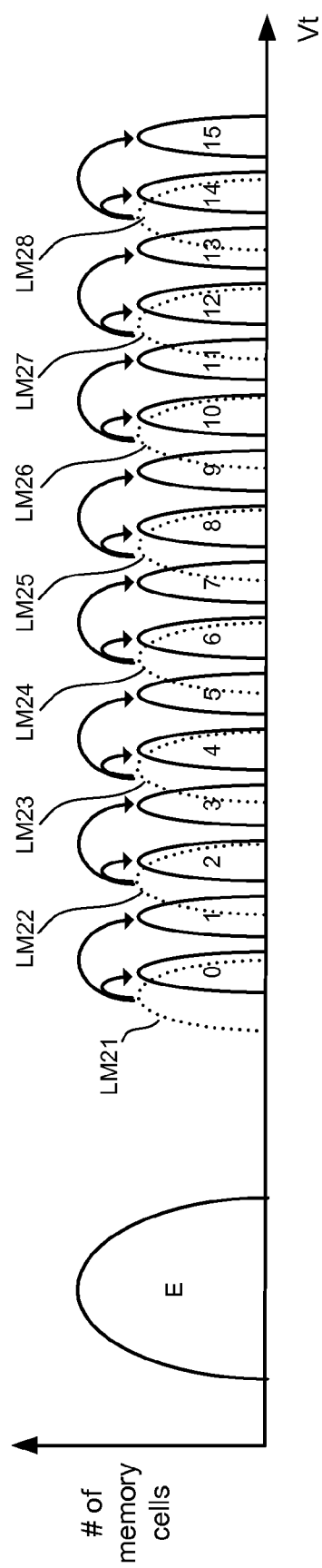

| WL # | 1st Pass | 2nd Pass | 3rd Pass | 4th Pass |
|---|---|---|---|---|
| 0 | 1 | 3 | 6 | 10 |
| 1 | 2 | 5 | 9 | 14 |
| 2 | 4 | 8 | 13 | 18 |
| 3 | 7 | 12 | 17 | 22 |
| 4 | 11 | 16 | 21 | 26 |
| 5 | 15 | 20 | 25 | 30 |
| 6 | 19 | 24 | 29 | 34 |
| 7 | 23 | 28 | 33 | 38 |
| 8 | 27 | 32 | 37 | 42 |
| 9 | 31 | 36 | 41 | 46 |

. . .

| WL # | 1st Pass | 2nd Pass | 3rd Pass | 4th Pass |
|---|---|---|---|---|
| 54 | 211 | 216 | 221 | 226 |
| 55 | 215 | 220 | 225 | 230 |
| 56 | 219 | 224 | 229 | 234 |
| 57 | 223 | 228 | 233 | 238 |
| 58 | 227 | 232 | 237 | 242 |
| 59 | 231 | 236 | 241 | 246 |
| 60 | 235 | 240 | 245 | 250 |
| 61 | 239 | 244 | 249 | 253 |
| 62 | 243 | 248 | 252 | 255 |
| 63 | 247 | 251 | 254 | 256 |

NON-VOLATILE STORAGE APPARATUS WITH VARIABLE INITIAL PROGRAM VOLTAGE MAGNITUDE

This application claims the benefit of provisional application No. 60/890,832, "Diagonal Sequence Write," by Nima Mokhlesi, filed on Feb. 20, 2007, incorporated herein by reference in its entirety.

CROSS-REFERENCE TO RELATED APPLICATIONS

The following applications are cross-referenced and incorporated by reference herein in their entirety: U.S. patent application Ser. No. 11/694,987, titled "Multiple Pass Write Sequence For Non-Volatile Storage" Inventor Nima Mokhlesi, filed the same day as the present application; U.S. patent application Ser. No. 11/694,989, titled "Non-Volatile Storage Apparatus With Multiple Pass Write Sequence," Inventor Nima Mokhlesi, filed the same day as the present application; U.S. patent application Ser. No. 11/694,990, titled "Variable Initial Program Voltage Magnitude For Non-Volatile Storage," Inventor Nima Mokhlesi, filed the same day as the present application; U.S. patent application Ser. No. 11/694,992, titled "Dynamic Verify Based on Threshold Voltage Distribution," Inventor Nima Mokhlesi, filed the same day as the present application; and U.S. patent application Ser. No. 11/694,993, titled "Non-Volatile Storage Apparatus With Dynamic Verify Based on Threshold Voltage Distribution," Inventor Nima Mokhlesi, filed the same day as the present application.

BACKGROUND OF THE INVENTION

1. Field of the Invention

The present invention relates to technology for non-volatile storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate and channel regions are positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique for Non-Volatile Memory;" U.S. Pat. No. 6,917,542, titled "Detecting Over Programmed Memory;" and U.S. Pat. No. 6,888,758, titled "Programming Non-Volatile Memory," all three cited patents are incorporated herein by reference in their entirety.

In many cases, the program voltage is applied to the control gate as a series of pulses (referred to as programming pulses), with the magnitude of the pulses increasing at each pulse. Between programming pulses, a set of one or more verify operations are performed to determine whether the memory cell(s) being programmed have reached their target level. If a memory cell has reached its target level, programming stops for that memory cell. If a memory cell has not reached its target level, programming will continue for that memory cell.

Some EEPROM and flash memory devices have a floating gate that is used to store two ranges of charges and, therefore, the memory cell can be programmed/erased between two states (an erased state and a programmed state). Such a flash memory device is sometimes referred to as a binary memory device.

A multi-state memory device stores multiple bits of data per memory cell by identifying multiple distinct valid threshold voltage distributions (or data states) separated by forbidden ranges. Each distinct threshold voltage distribution corresponds to a predetermined value for the set of data bits encoded in the memory device. For example, a memory cell that stores two bits of data uses four valid threshold voltage distributions. A memory cell that stores three bits of data uses eight valid threshold voltage distributions.

As the number of bits of data per memory cell (and, therefore, the number of valid threshold voltage distributions) are increased, the data capacity of a memory device increases. However, the time needed for programming also increases. Users typically do not want to wait for their electronic devices to store data. For example, users of digital cameras do not want delays between taking photographs.

As memory devices store more bits of data per memory cell, the need for reasonable program speeds has increased.

SUMMARY OF THE INVENTION

A non-volatile storage system is disclosed that dynamically sets the magnitude of the initial programming pulse in order to improve programming speed.

One embodiment includes a plurality of non-volatile storage elements and one or more managing circuits in communication with the plurality of non-volatile storage elements. The one or more managing circuits perform multiple programming processes for the plurality of non-volatile storage elements. Each of the programming processes operate to program at least a subset of the non-volatile storage elements to a set of target conditions using program pulses. For at least a subset of the programming processes, the one or more managing circuits identify a program pulse associated with achieving a particular result for a respective programming process and use that identified program pulse to adjust programming for a subsequent programming process. In one embodiment, a first programming pass includes soft programming and additional programming passes include the programming of data. In another embodiment, all of the programming process include programming data.

One embodiment includes a plurality of non-volatile storage elements, a word line connected to the control gates for all of the non-volatile storage elements, a plurality of bit lines that are each connected to one of the plurality of non-volatile storage elements, and one or more managing circuits in communication with the word line and bit lines. The one or more managing circuits operate the plurality of non-volatile storage elements via the word line and the bit lines. The one or more managing circuits perform multiple programming passes for a plurality of non-volatile storage elements. Each of the passes operate to program at least a subset of the non-volatile storage elements to a set of target conditions using program pulses. For at least a subset of the programming passes, the one or more managing circuits identify a program pulse at which a predetermined number of one or more non-volatile storage elements reach a target threshold voltage and set an initial magnitude for program pulses used in a subsequent programming pass based on the identified program pulse.

One embodiment includes a plurality of non-volatile storage elements and one or more managing circuits in communication with the plurality of non-volatile storage elements. The one or more managing circuits perform a first programming process for the plurality of non-volatile storage elements that program at least a subset of the non-volatile storage elements to a first set of one or more target conditions using a set of program pulses. The one or more managing circuits identify a program pulse of the first programming process at which a predetermined number of one or more non-volatile storage elements reach the first set of one or more target conditions. The one or more managing circuits perform a second programming process for the plurality of non-volatile storage elements that programs at least some of the non-volatile storage elements to a second set of one or more targets using a program pulse signal that has an initial magnitude based on the identified program pulse.

One embodiment includes a plurality of non-volatile storage elements and one or more managing circuits in communication with the plurality of non-volatile storage elements. The one or more managing circuits erase the non-volatile storage elements and soft program the non-volatile storage elements using a set of program pulses. The one or more managing circuits identify a program pulse for which a predetermined number of the non-volatile storage elements complete soft programming and adjust a data programming process based on the identified program pulses. The one or more managing circuits program a first subset of the non-volatile storage elements using the adjusted data programming process.

BRIEF DESCRIPTION OF THE DRAWINGS

FIG. 8 depicts an example coding of data into a set of data states associated with threshold voltage distributions.
FIG. 9 depicts an example coding of data into a set of data states associated with threshold voltage distributions.
FIGS. 11A-E depict a multi-pass programming process.

DETAILED DESCRIPTION

Figure 1:
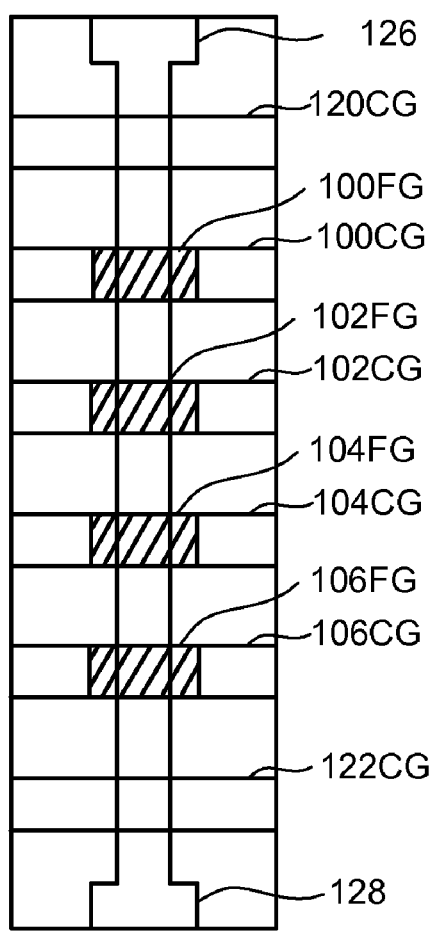
FIG. 1 is a top view of a NAND string.
Figure 2:
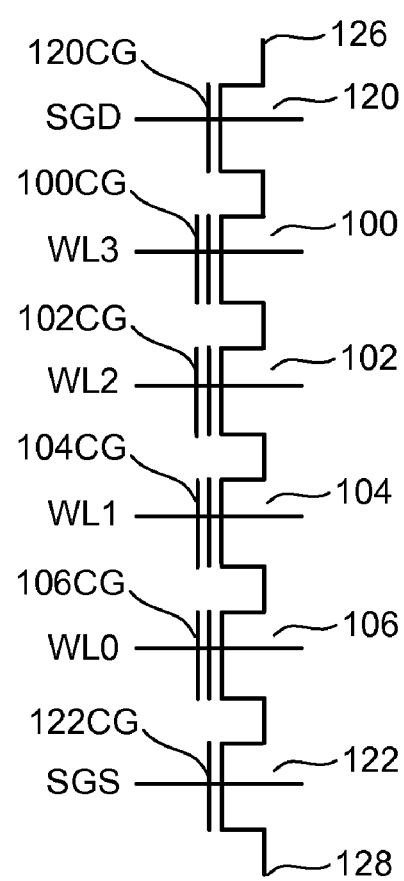
FIG. 2 is an equivalent circuit diagram of the NAND string.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have fewer than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011" "100", "101", "110" and "111."

The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted or otherwise randomized to reduce data pattern sensitivity and even wear on the memory cells.

Relevant examples of NAND type flash memories and their operation are provided in the following U.S. Patents/Patent Applications, all of which are incorporated herein by reference: U.S. Pat. Nos. 5,570,315; 5,774,397; 6,046,935; 6,456,528; and U.S. Pat. Publication No. US2003/0002348. The discussion herein can also apply to other types of flash memory in addition to NAND as well as other types of non-volatile memory.

Other types of non-volatile storage devices, in addition to NAND flash memory, can also be used. For example, a so called TANOS structure (consisting of a stacked layer of TaN—Al2O3-SiN—SiO2 on a silicon substrate), which is basically a memory cell using trapping of charge in a nitride layer (instead of a floating gate), can also be used with the present invention. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

Figure 3:
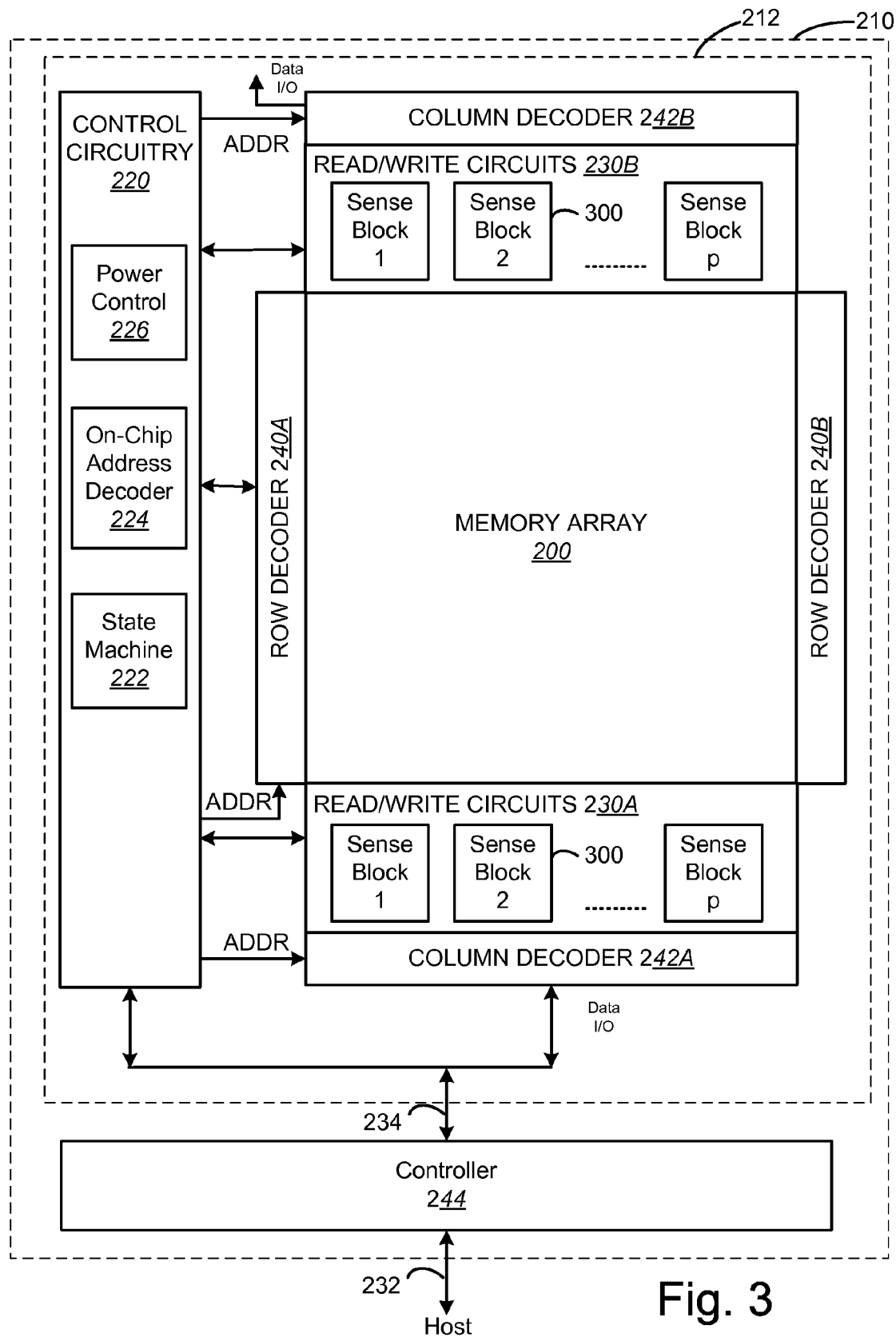
FIG. 3 is a block diagram of a non-volatile memory system.

FIG. 3 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 100 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 4:
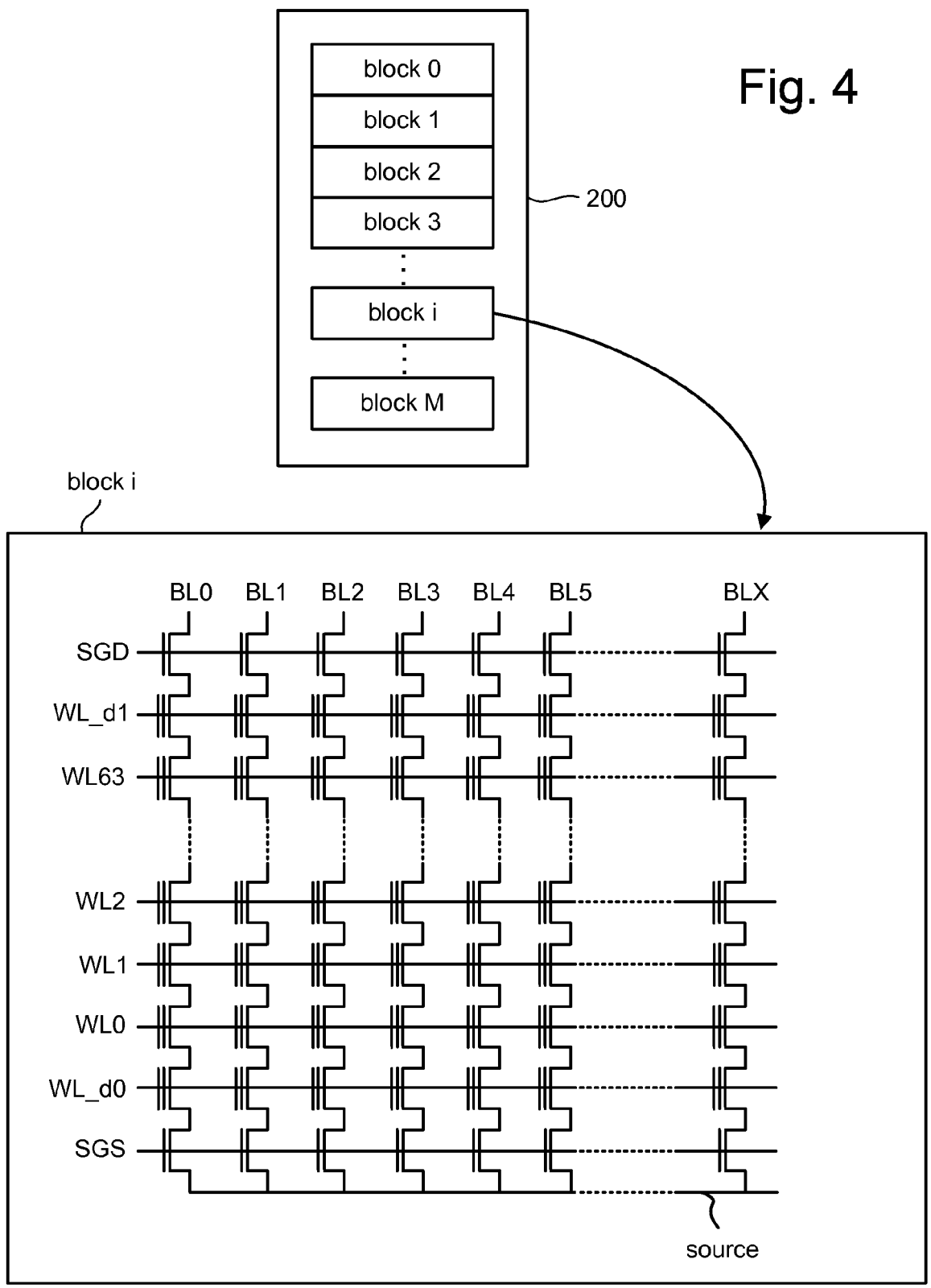
FIG. 4 is a block diagram depicting one embodiment of a memory array.

FIG. 4 depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 4 shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or less than 64 data memory cells and two dummy memory cells. Data memory cells can store user or system data. Dummy memory cells are typically not used to store user or system data. Some embodiments do not include dummy memory cells.

Figure 5:
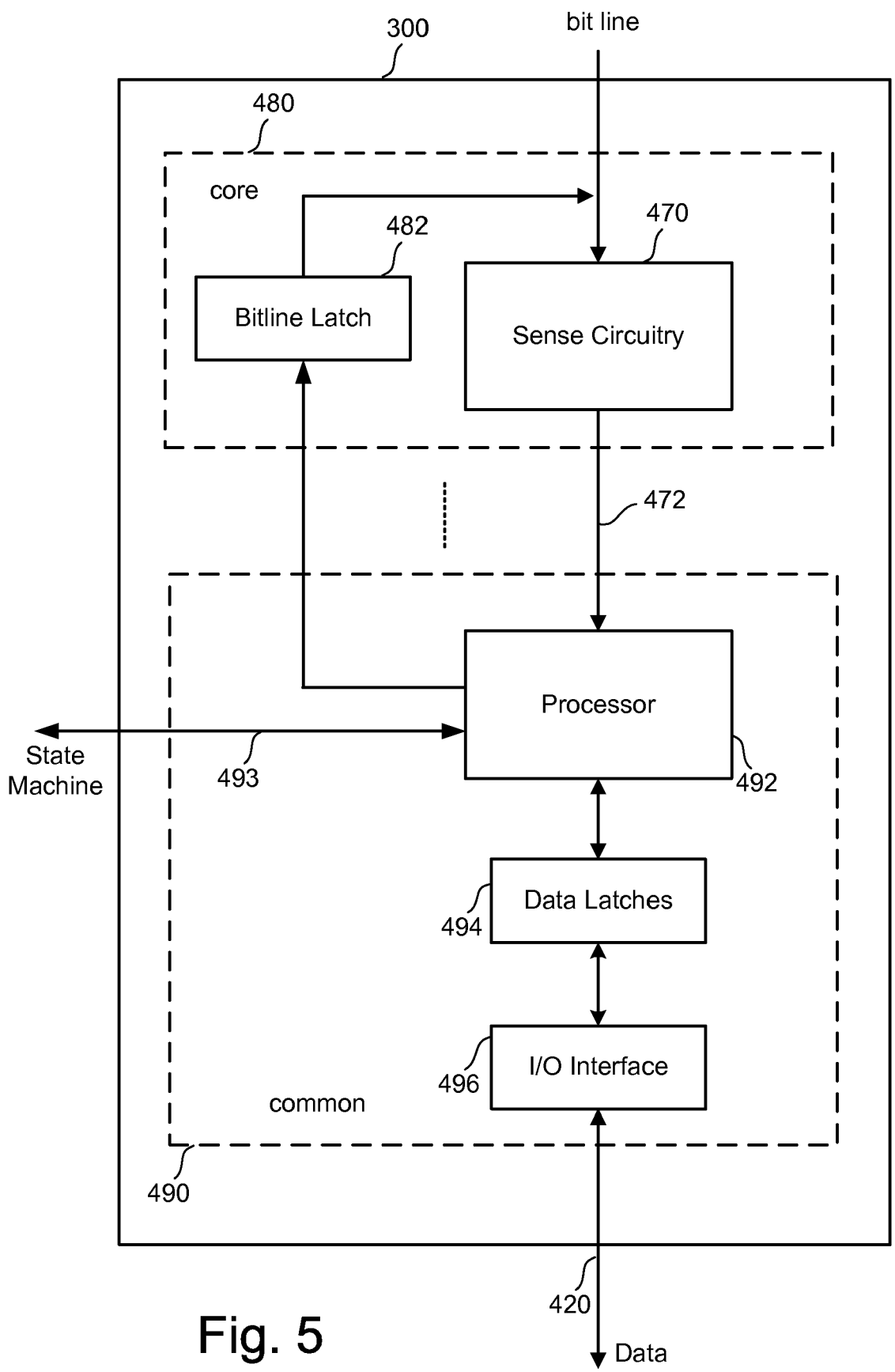
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Publication 2006/0221692, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

Figure 6:
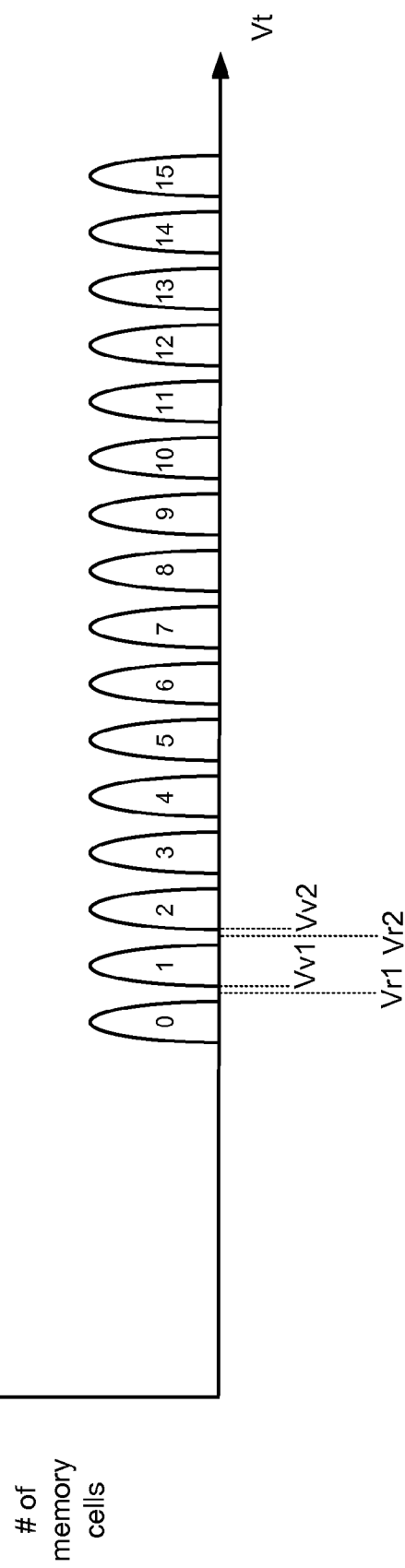
FIG. 6 depicts an example set of threshold voltage distributions.

At the end of a successful programming process (with verification), the threshold voltages of the memory cells should be within one or more distributions of threshold voltages for programmed memory cells or within a distribution of threshold voltages for erased memory cells, as appropriate. FIG. 6 illustrates example threshold voltage distributions corresponding to data states for the memory cell array when each memory cell stores four bits of data. Other embodiment, however, may use more or less than four bits of data per memory cell. FIG. 6 shows sixteen threshold voltage distributions corresponding to data states 0-15. In one embodiment, the threshold voltages in state 0 are negative and the threshold voltages in the states 1-15 are positive.

Between each of the data states 0-15 are read reference voltages used for reading data from memory cells. For example, FIG. 6 shows read reference voltage Vr1 between data states 0 and 1, and Vr2 between data states 1 and 2. By testing whether the threshold voltage of a given memory cell is above or below the respective read reference voltages, the system can determine what state the memory cell is in.

At or near the lower edge of each data state 0-15 are verify reference voltages. For example, FIG. 6 shows Vv1 for state 1 and vv2 for state 2. When programming memory cells to a given state, the system will test whether those memory cells have a threshold voltage greater than or equal to the verify reference voltage.

Figure 7:
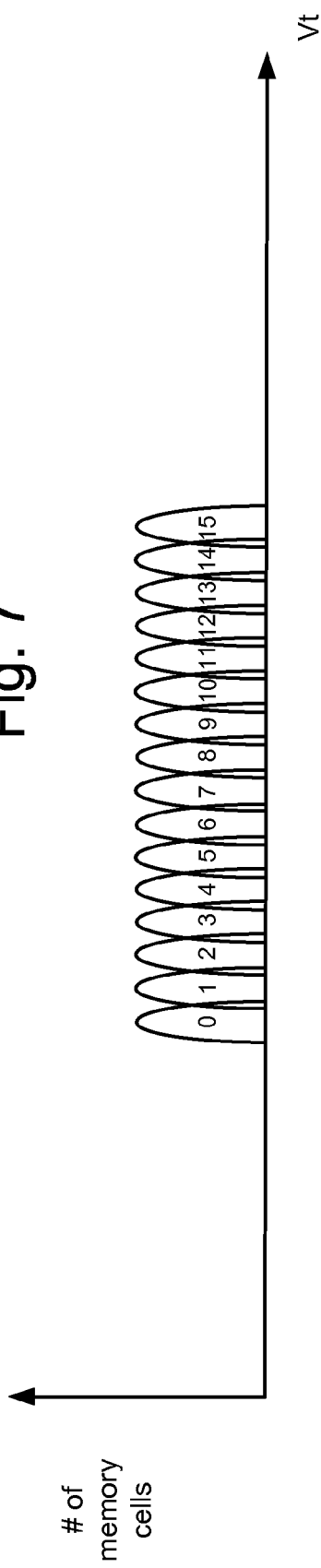
FIG. 7 depicts an example set of threshold voltage distributions.

FIG. 7 illustrates that another embodiment of threshold voltage distributions corresponding to data states 0-15 can partially overlap since the ECC can handle a certain percentage of cells that are in error.

Also note that the Vt axis may be offset from actual voltages applied to the control gates as body effect through source or body biasing is used to shift negative threshold voltage into the measurable positive range. Another point to note is that contrary to the equal spacing/width of the depicted sixteen states, various states may have different widths/spacings in order to accommodate varying amounts of susceptibility to retention loss. In some embodiments, states 0 and/or 15 are wider than the other states.

Each data state of FIG. 6 (or FIG. 7) corresponds to predetermined values for the data bits stored in the memory cells programmed to the respective states. FIG. 8 is a table providing an example of the data values assigned to each data state 0-15. In one embodiment, a memory cell stores data in four different pages. The four pages are referred to as the $1^{st}$ lower page, $2^{nd}$ upper page, $3^{rd}$ higher page and $4^{th}$ top page. FIG. 8 depicts the data in each page for each data state 0-15. In one embodiment, each page is programmed separately. In another embodiment, all four data bits for a memory cell are programmed at the same time.

FIG. 9 is a table providing another example of the data values assigned to each data state 0-15. The data values of FIG. 8 utilize a Gray code assignment so that only one bit changes between neighboring data states. This arrangement reduces the number of error bits if the threshold voltage of a memory cells is too low or too high.

Figure 10:
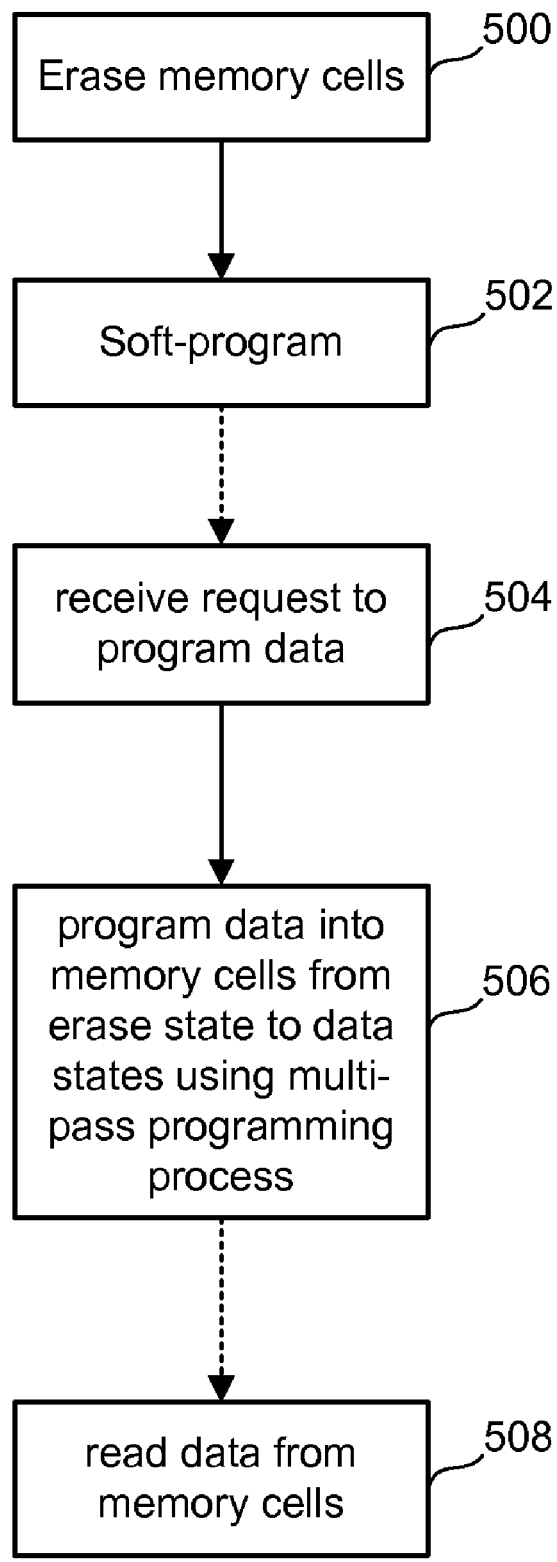
FIG. 10 is a flow chart describing one embodiment of a process for operating non-volatile storage.

FIG. 10 is a flow chart describing one embodiment for operating non-volatile memory cells. In many implementations, memory cells are erased (in blocks or other units) prior to programming. Memory cells are erased (see step 500), in one embodiment, by raising the p-well to an erase voltage (e.g., 20 volts) for a sufficient period of time and grounding the word lines of a selected block while the source and bit lines are floating. Due to capacitive coupling, the unselected word lines, bit lines, select lines, and source are also raised to a significant fraction of the erase voltage. A strong electric field is thus applied to the tunnel oxide layers of selected memory cells and the data of the selected memory cells are erased as electrons of the floating gates are emitted to the substrate side, typically by a Fowler-Nordheim tunneling mechanism. As electrons are transferred from the floating gate to the p-well region, the threshold voltage of a selected cell is lowered. Erasing can be performed on the entire memory array, a block, or another unit of cells. After the block of memory cells is erased, the various memory cells can be programmed as described herein.

In step 502, soft programming is optionally performed to narrow the distribution of erased threshold voltages for the erased memory cells. Some memory cells may be in a deeper erased condition than necessary as a result of the erase process. Soft programming includes applying programming pulses to move the threshold voltage of the erased memory cells to a tighter threshold voltage distribution. Between each programming pulse, a verify operation can be performed to determine whether memory cells are within the proper erased threshold voltage distribution. Memory cells that no longer need to be soft programmed prior to the soft programming process ending can be locked out of further soft programming by raising the corresponding bit line. The verify voltage can vary based on the particular implementation. Soft programming is known in the art. More information about soft programming can be found in U.S. Pat. No. 6,661,711, which is incorporated herein by reference. Note that no one particular scheme for performing soft programming is required. While soft programming may often be performed in association with an erase process, it may also be performed at the time of programming.

In step 504, a request to program data is received. The request can be received from a host or other device. A dotted line is depicted between steps 502 and 504 to indicate that an unpredictable amount of time and, potentially, some intervening tasks( including other programming operations) may pass between steps 502 and 504.

In step 506, data is programmed into the memory cells by using a multi-pass programming process to program the memory cells from the erased threshold voltage distribution to any of the threshold voltage distributions associated with valid data states. More details of step 506 are provided below.

In step 508, the data memory cells are read and the data read is provided to the user. For example, data from the memory cells is provided to a host by the controller. A dotted line is depicted between steps 506 and 508 to indicate that an unpredictable amount of time and, potentially, some intervening tasks may pass between steps 506 and 508. In some cases, the data may never be read. The process of FIG. 10 is performed by and at the direction of the controller 244 and/or control circuitry 220.

In general, during read and verify operations, the selected word line is connected to a voltage, a level (e.g., Vr1 or Vv1) of which is specified for each read and verify operation in order to determine whether a threshold voltage of the concerned memory cell has reached such level. The non-selected word lines are connected to an overdrive voltage (referred to as Vread) different from that of the selected word line. The overdrive voltage is typically chosen to be higher than the maximum threshold voltage that can be programmed to a data memory cell. The difference between the overdrive voltage and the threshold voltage can also be referred to as the overdrive. After applying the word line voltage to the selected word line, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that included the memory cell to discharge a voltage on the bit line. The voltage on the bit line is measured after a period of time to see whether it has been discharged or not. More details about reading data can be found in US Patent Publication 2006/0221683, incorporated herein by reference in its entirety.

FIGS. 11A-D describe a four pass programming process for programming data into memory cells that store four bits of data, as depicted in FIG. 6 or FIG. 7. Prior to programming, all of the memory cells for a block will be erased into an erased threshold voltage distribution (see step 500 of FIG. 10). For example, FIG. 11A shows a block of memory cells in an erased threshold voltage distribution E. In some embodiments, erased threshold voltage distribution E is below zero volts. In other embodiments, erased threshold voltage distribution E is above zero volts, or partially above zero volts. Negative threshold voltage distributions can be shifted into the positive region by raising the source voltage and thereby inducing a reverse body bias which tends to raise the threshold without changing the number of electrons on the floating gate. This change in threshold voltage by application of reverse body bias is due to the well known phenomenon of body effect. In the context most NAND memories the P-well constitutes the body. To simplify the diagrams, the Vt axes of FIGS. 11A to 11D are shifted with respect to the actual VT axis so that all VT's appear to be positive. In reality the negative VT's can be read with use of reverse body bias to raise these VT's above zero, and positive VT can be read without raising the body bias, in which case the maximum positive VT will be around 4V and not as high as 6V or more as may be reflected by the shifted Vt axes of these figures.

The first programming pass is depicted in FIG. 11B. During the first programming pulse, those memory cells that are to be eventually programmed to data states 0 through 7 will be programmed to a low threshold voltage distribution which is below the threshold voltage distribution for state 0. For example, FIG. 11B shows those memory cells being programmed to intermediate threshold voltage distribution LM01. The group of memory cells that are to be eventually programmed to data states 8 through 15 will be programmed to an intermediate threshold voltage distribution labeled LM02 on FIG. 11B. In one embodiment, threshold voltage distribution LM02 is not greater than the threshold voltages for data state 7. Between programming pulses of this first pass, two verify operations are performed: one for LM01 and one for LM02. Thus, between program pulses, two verify pulses will be used. It may be possible to only use one verify pulse (for LM01 only) at the beginning of the program process until at least one memory cell has reached LM01, at which time the system will use two verify pulses. In other embodiments, the first programming pass can program to more than two threshold voltage distributions. In one embodiment, data is erased to state 0 and memory cells that are to be eventually programmed to data states 8 through 15 will be programmed to an intermediate threshold voltage distribution, while memory cells that are to be eventually programmed to data states 0 through 7 will remain in state 0. In another embodiment, LM01 can slightly overlap with the erased threshold voltage distribution E since the ECC can handle a certain percentage of memory cells that are in error. Thus, the programming pass can end when all but K bits have verified, with K being a number that can be corrected by ECC.

The second programming pass is depicted in FIG. 11C. Those memory cells that are to be programmed to data states 0 through 3 will be programmed from LM01 to threshold voltage distribution LM11. For example, FIG. 11C shows threshold voltage distributions LM01 (dotted) and LM11 (solid line). Memory cells that are to be eventually programmed to data states 3 through 7 will be programmed from LM01 to intermediate threshold voltage distribution LM12. Memory cells that are to eventually be programmed to data states 8 through 11 will be programmed from LM02 to intermediate threshold voltage distribution LM13. Those memory cells that are eventually to be programmed to data states 12 through 15 will be programmed from LM02 to intermediate threshold voltage distribution LM14. During the second programming pass, up to four verify operations need to be performed between programming pulses: one verify operation for LM11, one verify operation for LM12, one verify operation for LM13 and one verify operation for LM14. Therefore, between each programming pulse, there will be up to four verify pulses. It may be possible, in some embodiments, to reduce the number of verify pulses by using an intelligent scheme for determining when it is possible to omit some of the verify pulses because no memory cells could be near a particular target. Various schemes can be used. More information about efficient verification schemes can be found in U.S. Pat. No. 7,073,103, incorporated herein by reference in its entirety. Because the ECC can handle a certain percentage of memory cells that are in error, in another embodiment LM11 can overlap with LM12 and LM13 can overlap with LM14. Additionally, LM12 can overlap with LM01 or LM02, and LM14 can overlap with LM02. Thus, the programming pass can end when all but K bits have verified, with K being a number that can be corrected by ECC.

The third programming pass is depicted in FIG. 11D. Those memory cells that are eventually to be programmed to data state 0 and 1 will be programmed from LM11 to intermediate threshold voltage distribution LM21. Those memory cells that will be programmed to data states 2 and 3 are programmed from LM11 to intermediate threshold voltage distribution LM22. Those memory cells that are to be programmed to data states 4 and 5 are programmed from LM12 to intermediate threshold voltage distribution LM23. Those memory cells that are to be programmed to data states 6 and 7 are programmed from LM12 to intermediate threshold voltage distribution LM24. Those memory cells that are to be programmed to data states 8 and 9 are programmed from LM13 to intermediate threshold voltage distribution LM25. Those data cells that are to be programmed to data states 10 and 11 are programmed from LM13 to intermediate threshold voltage distribution LM26. Those data cells that are to be programmed to data states 12 and 13 are programmed from LM14 to intermediate threshold voltage distribution LM27. Those memory cells that are to be programmed to data states 14 and 15 are programmed from LM14 to intermediate threshold voltage distribution LM28. Because the ECC can handle a certain percentage of memory cells that are in error, in another embodiment neighboring LM2x distributions can overlap with each other (e.g., LM26 can overlap with LM25). Additionally, LM2x distributions can also overlap with LM1x distributions (e.g., LM26 can overlap with LM13). Thus, the programming pass can end when all but K bits have verified, with K being a number that can be corrected by ECC.

The fourth programming pass is depicted in FIG. 11E. In the fourth programming pass, memory cells to be programmed to data state 0 are programmed from LM21 to data state 0. Memory cells to be programmed to data state 1 are programmed from LM21 to data state 1. Memory cells to be programmed to data state 2 are programmed from LM22 to data state 2. Memory cells to be programmed to data state 3 are programmed from LM22 to data state 3. Memory cells that are to be programmed to data state 4 are programmed from LM23 to data state 4. Memory cells that are to be programmed to data state 5 are programmed from LM23 to data state 5. Memory cells that are to be programmed to data state 6 are programmed from LM24 to data state 6. Memory cells that are to be programmed to data state 7 are programmed from LM24 to data state 7. Memory cells that are to be programmed to data state 8 are programmed from LM25 to data state 8. Memory cells that are to be programmed to data state 9 are programmed from LM25 to data state 9. Memory cells that are to be programmed to data state 10 are programmed from LM26 to data state 10. Memory cells that are to be programmed to data state 11 are programmed from LM26 to data state 11. Memory cells that are to be programmed to data state 12 are programmed from LM27 to data state 12. Memory cells that are to be programmed to data state 13 are programmed from LM27 to data state 13. Memory cells that are to be programmed to data state 14 are programmed from LM28 to data state 14. Memory cells that are to be programmed to data state 15 are programmed from LM28 to data state 15. As discussed above with respect to FIG. 7, another embodiment includes data states 0-15 overlapping. Other embodiments may include intermediate LM states that overlap with one another, specially if the binary version of the data remains until the entire block goes through the entire programming sequence.

In one embodiment, when receiving a request to program data, the request is accompanied by data for all four pages so that all of the memory cells on a word line can be programmed to any one of data states 0 through 15. In that case, the four programming passes of FIGS. 11A-D are performed based on the data received.

In another embodiment, a memory system can receive less than all four pages at a time. In that case, the memory cells can be originally written as binary memory cells, with each page of data being written in different blocks. Memory will be erased to the erased state and one bit of data will be programmed into the memory cells so that some memory cells remain in the erased state (data 1) and some memory cells will be in the programmed state (data 0). When a first page of memory is received, that data is written to a first block of memory cells in binary mode. When the second page of data is received, that data is written to a second block of memory cells. When the third page of data is received, that page of data is written to a third block of memory cells in binary form. When the fourth page of data is received, that data is written to a fourth block of memory cells in binary form. Once all four blocks have been written, the system then can rewrite all four blocks into one block by programming four bits of data per memory cell using the four pass programming process of FIGS. 11A-D.

In another embodiment, one binary block is written page by page until it is completely written. Then another binary block is written page by page until that is completely written too. Subsequently, a third binary block and a forth binary block are written in the same manner as the first two blocks. Once four complete binary blocks become available, then the data from these four blocks is condensed and written to block in the form of 4 bits per memory cell. In one embodiment, the data from the binary blocks is first sent to the controller chip where the binary ECC decoding is performed, and then another type of ECC encoding appropriate for 16 states per cell is performed in addition to data scrambling, and the new data is sent back to the memory chip for the 4 state per cell block to be written.

Figure 12:
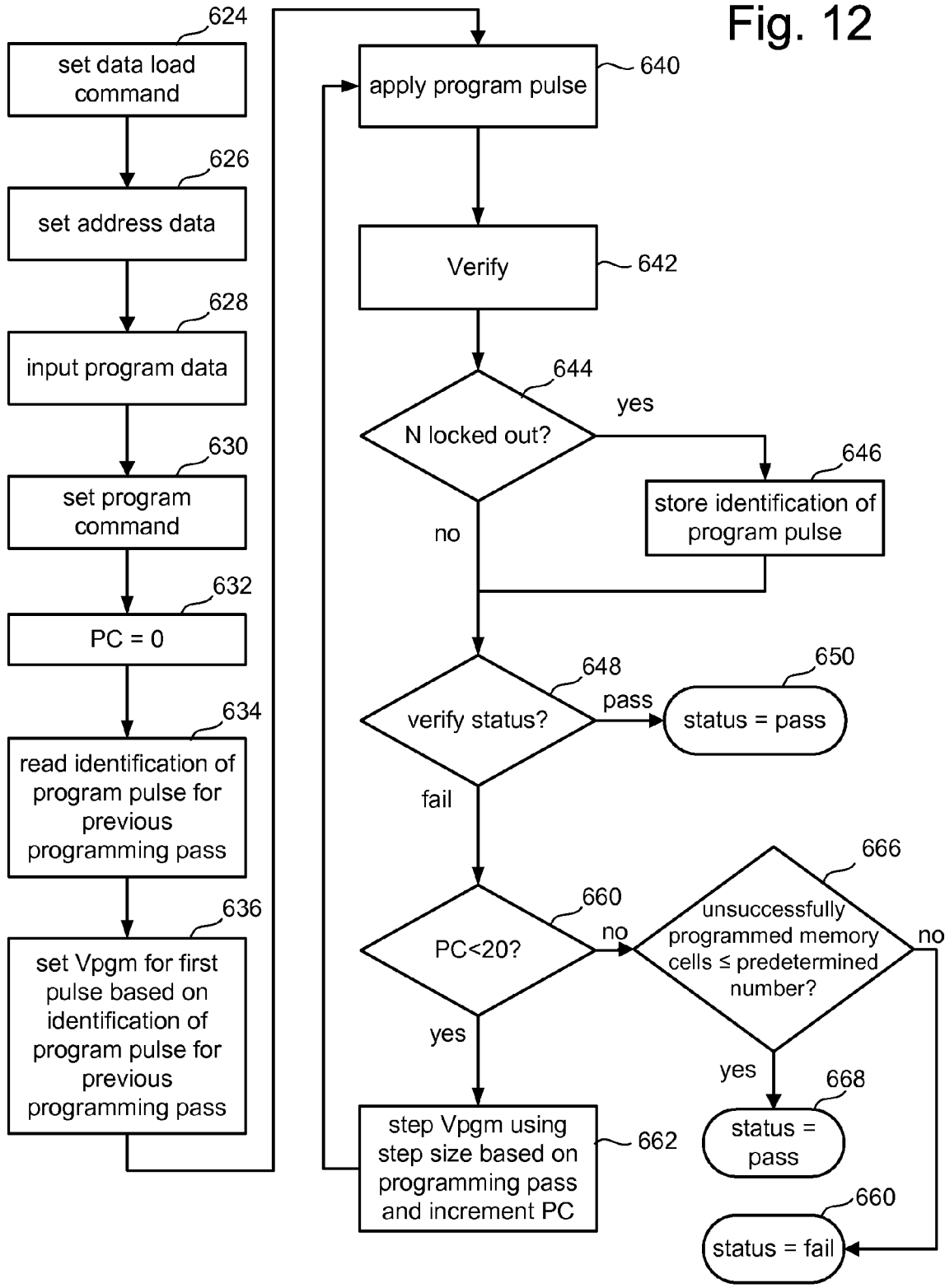
FIG. 12 is a flow chart describing one embodiment of a process for programming non-volatile storage.

FIG. 12 is a flow chart describing a programming process for programming memory cells connected to a selected word line. Many different programming techniques can be used with the present invention. In one embodiment, the process of FIG. 10 is performed by and/or at the direction of control circuitry 220 (state machine 222 provides the control and power control 226 provides the appropriate signals) and/or at the direction of controller 244. In one embodiment, the process of FIG. 12 is used to perform one pass of the four pass programming process of FIGS. 11A-E for memory cells connected (e.g. by their control gates) to one word line.

In step 624, a "data load" command is issued by controller 244 and input to state machine 222. In step 626, address data designating the page address is provided to the decoder circuitry. In step 628, a page of program data for the addressed page(s) is input for programming. For example, 528 bytes of data could be input in one embodiment. That data is latched in the appropriate registers/latches for the selected bit lines. In some embodiments, the data is also latched in a second register for the selected bit lines to be used for verify operations. In step 630, a "program" command is received from controller 244 and provided to state machine 222. Triggered by the "program" command, the data latched in step 628 will be programmed into the selected memory cells controlled by state machine 222 using a set of pulses applied to the appropriate word line. In step 732, program counter PC maintained by state machine 222 is initialized at 0.

In some embodiments, at least a subset of the programming passes will include identifying a program pulse associated with achieving a particular result for a respective programming process and using the identified program pulse to adjust programming for a subsequent programming process for the non-volatile storage elements. In one example, the system will identify the program pulse that results in the first memory cells reaching its target. In another example, the system will identify the program pulse that results the first N memory cells reaching their target, with N being a number less than the amount of errors that can be corrected by ECC. That identified pulse will have a magnitude. In one embodiment, the magnitude of the first pulse for the subsequent programming pass will be set at the same magnitude as the identified pulse. For example, if the fourth program pulse of the first programming pass resulted in the first memory cell to reach its target and the magnitude of that fourth program pulse is 14 volts, then the magnitude of the first program pulse of the second programming pass will be set at 14 volts. In this way, observed behavior in one programming pass can affect a subsequent programming pass.

In other embodiments, other variations can be performed. For example, the first pulse of the subsequent pass could be set based on the identified pulse of the previous pass but not made to be exactly equal in magnitude.

Additionally, the program pulse from the previous programming pass can be associated with a different event than the first memory cell(s) reaching its target. For example, a programming pulse can be identified when a memory cell reaches an intermediary level or other condition.

Thus, when starting a new programming pass, the system will access the information identifying the program pulse from the previous programming pass that was associated with achieving the predefined particular result (step 634). The system will read the information identifying the pulse from a register, a flash memory cell or other non-volatile storage device. In one embodiment, step 634 is not performed for the first pass of a multi-pass programming process and the initial magnitude of the first programming pulse is set at a nominal value of 10-17 volts, depending on device characterization.

In step 636, the magnitude of the first program pulse of the programming signal Vpgm is set based on the pulse identified from the previous programming pass and read in step 634. In step 640, one pulse of the program signal Vpgm is applied to the selected word line.

In step 642, the data states of the selected memory cells are verified using the appropriate set of target levels. If it is detected that the threshold voltage of a selected memory cell has reached the appropriate target level, then the memory cell is locked out of future programming for the remainder of the process of FIG. 10 by raising its bit line voltage. Other lockout techniques can also be used.

If it is detected for the first time during this programming pass that the first N (where N could be 1 or more) memory cells being programmed have reached their target data states, then in step 644 information about this program pulse is stored (step 646) in a non-volatile storage device such as a flash memory cell or register. This is the pulse that will be used to set the magnitude of the first pulse for the next programming pass. In one alternative, step 644 is performed by determining whether N memory cells have been changed from not being locked out to being locked out of further programming because they have reached their target state. In some embodiments, the analysis of step 644 would not be performed on memory cells that are programmed from LM01 to LM11, from LM02 to LM13, from LM11 to LM21, from LM12 to 23, from LM13 to LM25 and LM14 to LM27. In one embodiment, steps 644 and 646 are not performed for the last pass of a multi-pass programming process.

After step 646, the process continues at step 648. If the current pulse was not the first time during this programming pass that the first N memory cells being programmed have reached their target data states, then the process would continue at step 648 without performing step 646.

If all memory cells being programmed have reached their target data states (step 648), then the programming process is complete and successful. A status of "PASS" is reported in step 650. Note that in some implementations of step 648, it is checked whether at least a predetermined number of memory cells have been verified to have reached their target states. This predetermined number can be less than the number of all memory cells, thereby allowing the programming process to stop before all memory cells have reached their appropriate verify levels. The memory cells that are not successfully programmed can be corrected using error correction during the read process.

If, in step 648, it is determined that not all of the memory cells have reached their target states, then the programming process continues. In step 660, the program counter PC is checked against a program limit value. One example of a program limit value is 20; however, other values can be used in various implementations. If the program counter PC is not less than the program limit value, then it is determined in step 666 whether the number of memory cells that have not been successfully programmed is equal to or less than a predetermined number. If the number of unsuccessfully programmed memory cells is equal to or less than the predetermined number, then the programming process is flagged as passed and a status of PASS is reported in step 668. In many cases, the memory cells that are not successfully programmed can be corrected using error correction during the read process. If, however, the number of unsuccessfully programmed memory cells is greater than the predetermined number, the program process is flagged as failed and a status of FAIL is reported in step 670. If, in step 660, it is determined that the program counter PC is less than the program limit value, then the magnitude of the next Vpgm pulse is increased by the step size and the program counter PC is incremented in step 662. After step 662, the process loops back to step 640 to apply the next Vpgm pulse.

The program pulses of the programming signal Vpgm have rising magnitudes that increase by a step size. In one embodiment, the step size is constant so that every pulse of every programming pass increases from its previous pulse by the same step size. In another embodiment, each programming pass (or a subset of program passes) will utilize a different step size (see step 652). For example, the first programming pass will have a step size of 0.4 volts; the second programming pass will have a step size of 0.7 volts; the third programming pass will have a step size of 0.35 volts, and the fourth programming pass will have a step size of 0.17 volts. Other values can also be used.

In an alternative embodiment, step 644 and step 646 will only be performed during the first programming pass. Therefore, the three subsequent programming passes will use a magnitude for a first program pulse be based on the first programming pass.

The process of FIG. 12 is performed once for each programming pass. In a case where there are 64 word lines and four programming passes per word line, the process of FIG. 12 can be performed 4×64 times for each block.

Figures 12A, 13:
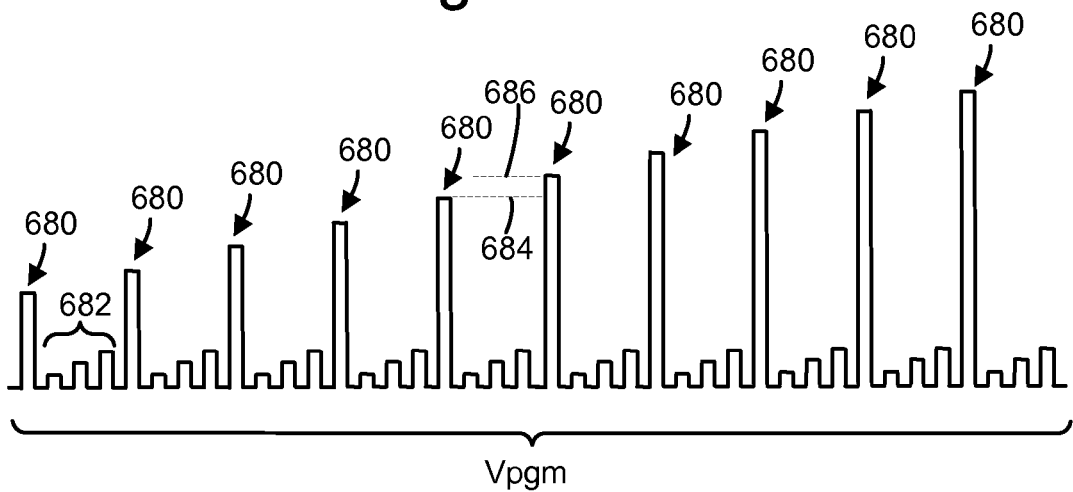
FIG. 12A depicts programming pulses and verify pulses applied to controls gates of selected memory cells.
FIG. 13 is a chart describing one embodiment of a sequence for performing the four pass programming process on multiple word lines.

FIG. 12A shows an example of the programming voltage signal Vpgm having a set of program pulses 680 that increase in magnitude by a step size. The step size is illustrated by the space between lines 684 and 686. In between the program pulses are verify pulses (e.g., verify pulses 682). FIG. 12A shows three verify pulses that can be used to distinguish four data states. Only three pulses are depicted to make the figure easy to read. In one embodiment that uses sixteen data states, there could be up to fifteen verify pulses between program pulses. Looking back at FIG. 12, step 640 includes applying one program pulse 680 and step 642 includes applying one set of verify pulses (e.g., a set of up to fifteen pulses) 682.

FIG. 13 describes the order for programming the different programming passes on the different word lines of a block of memory. For example, FIG. 13 identifies the initial operation as the first pass (FIG. 11B) being performed on word line WL0, followed by the first pass being performed on word line WL1, followed by the second pass (FIG. 11C) being performed on WL0, followed by the first pass being performed on WL2, followed by the second pass being performed on WL1, followed by the third pass (FIG. 11D) being performed on WL0, followed by the first pass being performed on WL3, ... followed by the fourth pass (FIG. 11E) being performed on WL63. The sequence of programming passes depicted by FIG. 13 is referred to as a diagonal sequence process because the order proceeds diagonally along the chart of FIG. 13. In other embodiments, other sequences can be used.

In one embodiment, each pass can correspond to a page of data. For example, looking at FIGS. 8 and 11B, if the lower page is to receive data 1 then the memory cell is programmed to LM01 and if the lower page is to receive data 0 then the memory cell is programmed to LM02. Thus, after the first programming pass, it is possible to read whether the lower page data is 1 or 0 based on whether the threshold voltage of the memory cell is in LM01 or LM02. The second programming pass can correlate to the programming of the upper page of data. For example, looking at FIGS. 8 and 11C, if the second upper page of data is to be data 1, then the memory cells would be programmed to either LM11 or LM13. If the upper page data is to be data 0, then the memory cells will be programmed to LM12 or LM14. By testing which threshold voltage distribution the memory cell's threshold voltage is in, the second page of data as well as the first page of data can be read. The third programming pass can correspond to programming the higher page of data. For example, higher page data to be data 1 would be stored in LM21, LM23, LM25 and LM27. Data 0 would be stored in LM22, LM24, LM26 or LM28. The fourth pass can correspond to programming the top page of data into the appropriate data state.

Figure 14:
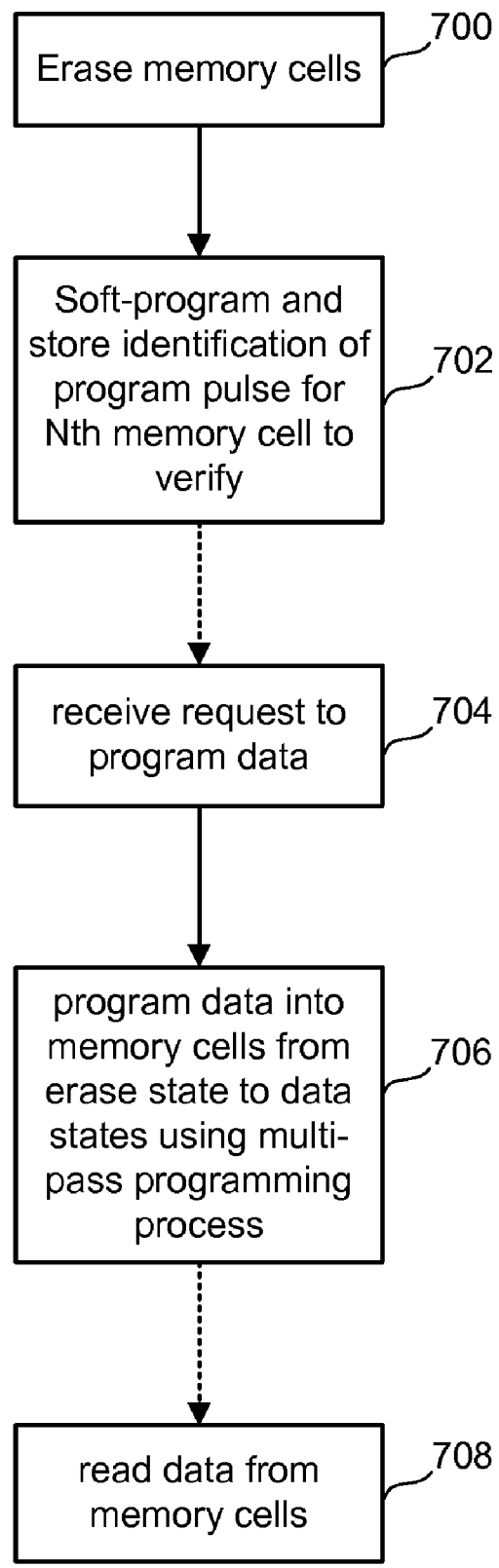
FIG. 14 is a flow chart describing one embodiment of a process for operating non-volatile storage.

FIG. 14 is a flowchart describing a process for operating nonvolatile memory in an alternative embodiment that uses the results of soft programming to adjust the programming passes. In step 700, a block of memory cells are erased. In step 702, soft programming is performed. The process of soft programming could include performing the process of FIG. 12 with some slight modifications. Step 634 would not need to be performed and step 636 would always set the voltage for the initial pulse at some nominal value (e.g., between 10 and 17 volts depending on device characterization). When N memory cells have been locked out from soft programming because they have reached the appropriate target threshold voltage distribution for erased memory cells, the identification of that programming pulse will be stored in step 646 of FIG. 12. Information identifying the program pulse can be stored in a register or a flash memory cell. In step 704, a request to program data is received. There is a dotted line between step 702 and 704 to indicate that in a period of time and intervening steps can be performed in the interim. In some embodiments, data can be programmed without receiving a request to program data. In step 706, data is programmed into the memory cells from the erased threshold voltage distribution using the multi-pass programming process of FIG. 11A-E (or another multi-pass programming process). In each of the programming passes of FIG. 14, the magnitude of the first program pulse is set based on the observed behavior in the soft programming process of step 702. In step 708, data is read from the memory cells. In one embodiment, as depicted in FIG. 14, soft programming performed in association with the erasing of memory cells. In other embodiments, soft programming can be performed in association with the programming (e.g., in response to a request to program).

Figure 15:
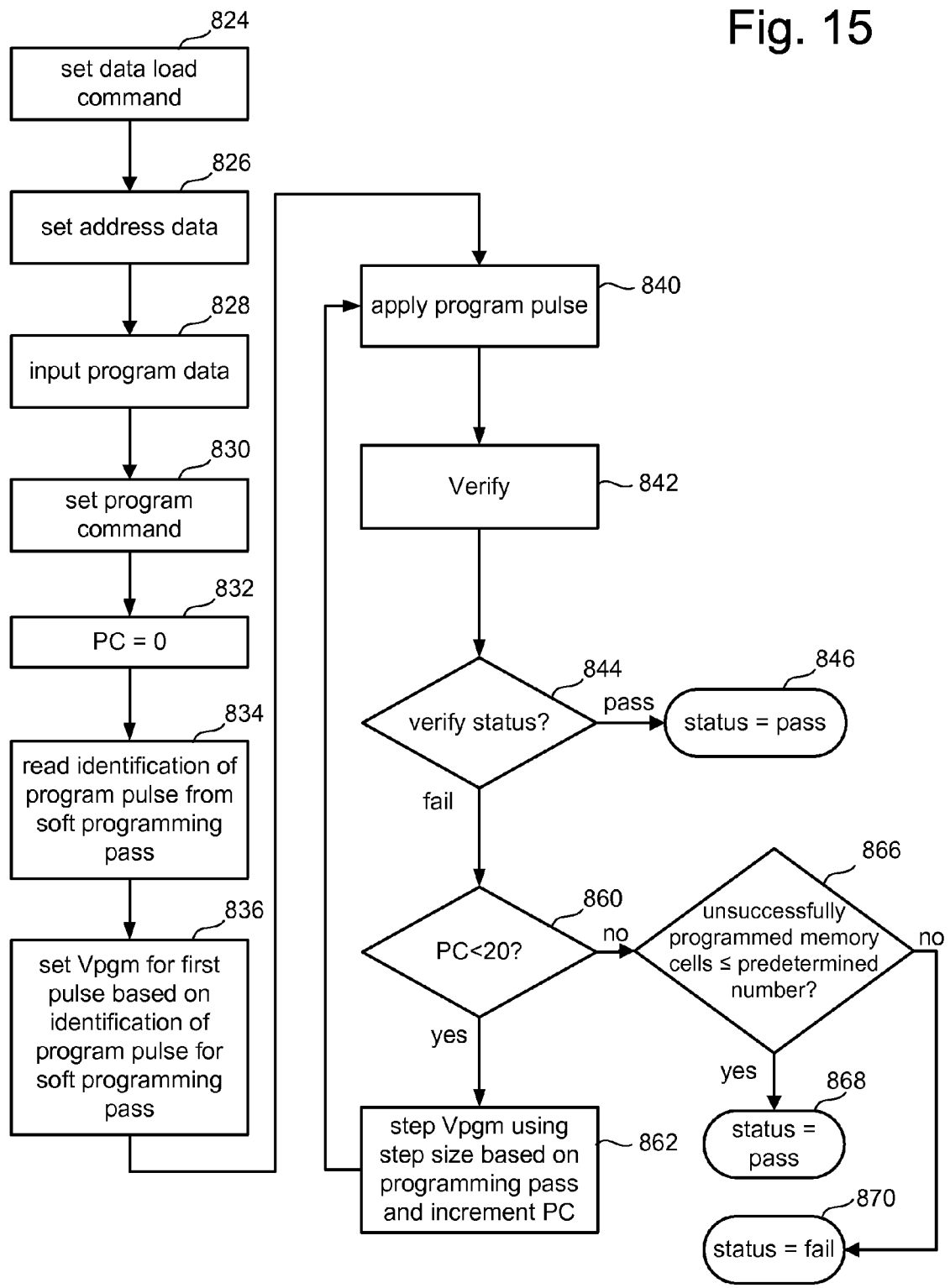
FIG. 15 is a flow chart describing one embodiment of a process for programming non-volatile storage.

FIG. 15 provides an example of a flowchart for performing step 706 of FIG. 14. Steps 824-832 of FIG. 15 are the same as steps 624-632 of FIG. 12. In step 834, the system reads the identification of the program pulse from the soft programming pass that was stored in step 702 of FIG. 14. In step 836, the magnitude of the first program pulse for the programming signal Vpgm is set based on that identified pulse read in step 834. In one embodiment, the magnitude for the first program pulse of the current programming pass is set to be the same as the magnitude of the pulse read in step 834. Thus, the information read in step 834 could include magnitude information, pulse number information (from which the magnitude can be calculated) or other information that can be used to identify the appropriate magnitude. In step 840, the program pulse is applied to the word line selected for programming. In step 842, the memory cells along the selected word line are verified. If all or a predetermined number of memory cells pass the verification (step 844), then the process is complete and successful in step 846 (status=pass). If not all or not enough of the memory cells verify, then it is determined in step 860 whether the program counter is below a predetermined limit. If it is below the predetermined limit, then at step 862 the magnitude of the voltage of the program signal Vpgm is increased by the step size and the program counter is also increased. As described above, the step size may vary based on which programming pass is being performed. After step 862, the process loops back to step 840 and the next program pulse is applied. If it is determined, in step 860, that the program counter is greater than the predetermined limit and the number of unsuccessfully programmed memory cells is less than a predetermined number (step 866), then the process completes successfully in step 868 (status=pass). Otherwise, if the number of unsuccessfully programmed memory cells is not less than or equal to the predetermined number (step 866), then the process fails in step 870.

The process of FIG. 15 is performed once for each programming pass. In a case where there are 64 word lines and four programming passes per word line, the process of FIG. 15 can be performed 4×64 times for each block.

Figure 16:
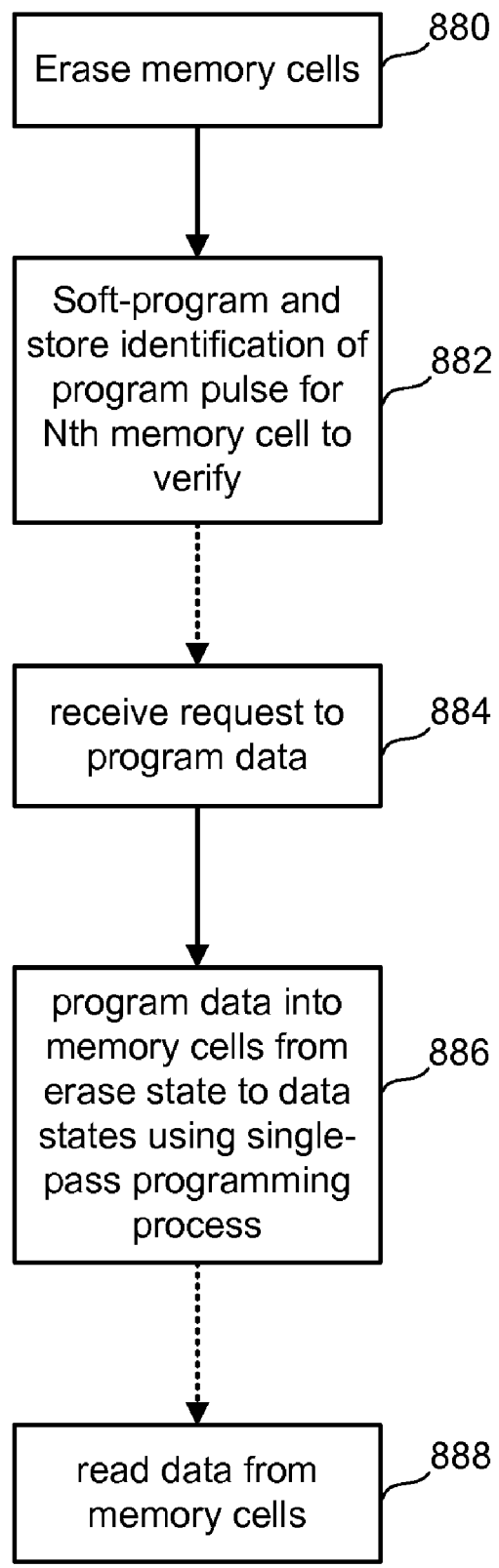
FIG. 16 is a flow chart describing one embodiment of a process for operating non-volatile storage.

FIG. 16 provides a flowchart for another embodiment which uses the soft programming process to determine the initial magnitude of the programming signal for a single pass programming process. In step 880, a block of memory cells are erased. In step 882, soft programming is performed and the system stores the identification of the program pulse associated with when N memory cells verify to the erased threshold voltage distribution. As discussed above, N can be equal to 1, 2, . . . , depending on the device implementation. Step 882 of FIG. 16 is the same as step 702 of FIG. 14. In step 884, a request to program data is received. In step 886, data is programmed into memory cells from the erased threshold voltage distribution to any of the data states using a single pass programming process. In step 888, memory cells are read and the data is provided to a user.

In one embodiment, step 886 is performed by implementing the process of FIG. 15 once for each word line. That is, there is one pass for each word line. In one embodiment, step 880 programs memory cells to the erased threshold voltage distribution E and step 886 programs the memory cells from erased threshold voltage distribution E to any of the data states 0 through 15. In another embodiment, step 880 erases the memory cells to data state 0 and step 886 programs all or a subset of memory cells from data state 0 to any of data states 1 through 15.

Figure 17:
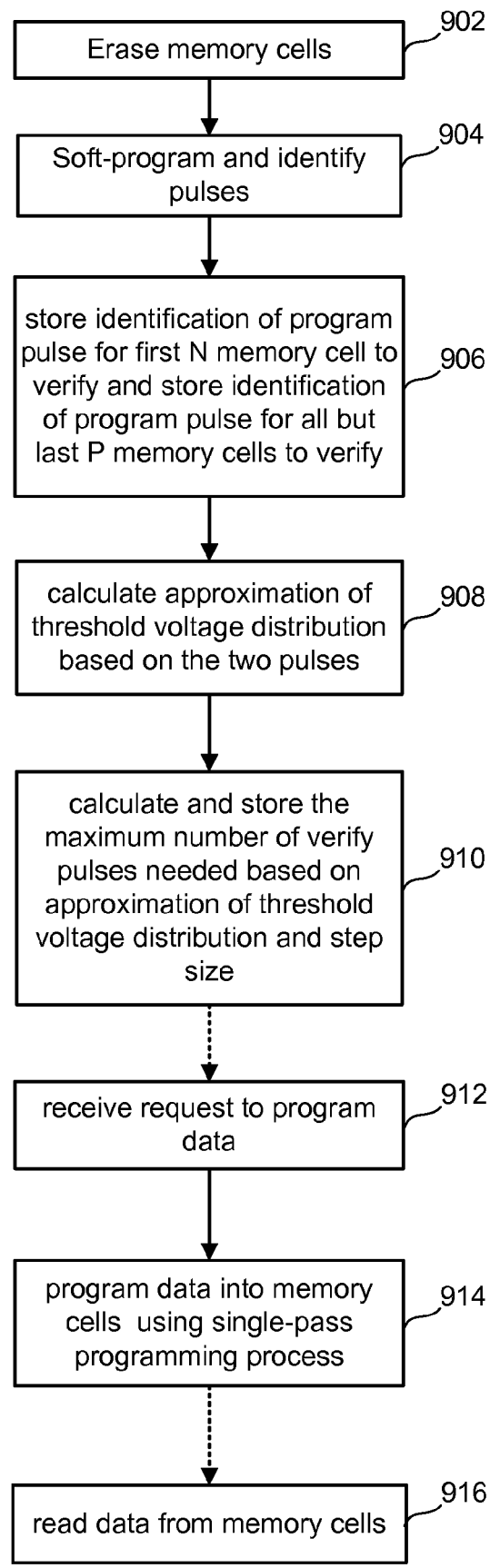
FIG. 17 is a flow chart describing one embodiment of a process for operating non-volatile storage.

FIG. 17 is a flowchart describing one embodiment of a process for operating memory cells that uses the soft programming process to alter the verification portion of the programming process. In step 902, memory cells of a block are erased. In step 904, a soft programming process is performed. In one embodiment, memory cells can be erased to the erased threshold voltage distribution E. In other embodiments, the memory cells can be erased to data state 0. During the soft programming, the system will identify the programming pulse to which the Nth memory cell (where N equals 1 or higher) verified to the appropriate erased threshold voltage distribution. The system will also identify when all but P memory cells (where P equals 0 or higher) have verified. The values for N and P can be chosen based on ECC and/or device characterization. By knowing the two pulses discussed above, the natural threshold voltage distribution for the memory cells can be estimated. For example, if N equals 2, P equals 8, and the step size is 0.4 volts, the natural threshold voltage distribution is (8−2)×0.4=2.4 volts. This information allows for the determination of the number of verify operations required after each program pulse. For example, the number of verify operations can be reduced to (2.4+0.3)/0.35=8 verifies for each program pulse, even though there are sixteen data states. The first few and last few program pulses can have even less than eight verify operations. In the above equation, 0.3 represents the margining for program noise and 0.35 represents the state-to-state threshold voltage separation for one example implementation.

In step 906, the two identified program pulses are stored in nonvolatile storage (e.g., register, flash memory cell, etc.). In step 906, the system calculates an approximation of the threshold voltage distribution based on the two pulses identified, as discussed above. In step 910, the system will calculate and store the maximum number of verify pulses needed based on the approximation of threshold voltage distribution and step size, as discussed above. In step 912, a request to program data is received. The line between steps 910 and 912 is dotted to indicate that an unpredictable amount of time and intervening operations can be performed between step 910 and step 912. In step 914, data is programmed into memory cells using a single pass programming process. In another embodiment, step 914 could include performing a multi-pass programming process. In step 916, data is read from the memory cells and reported to the user or host.

Step 914 can be implemented by using the process of FIG. 15; however, when performing a single pass programming process, the step size will not be changed in each pass. Rather it will remain constant at a value determined based on device characterization (e.g. 0.1-0.4 volts). In one embodiment, the process of FIG. 17 could also include setting the magnitude of the initial program pulse based on soft programming, as discussed above. In one embodiment, word lines are programmed in an order starting from the word line closest to the source line and working towards the bit line contact; for example, starting at WL0 and ending at WL63. Thus, the process of FIG. 15 would be performed 64 times, once for each word line, in a single pass programming process.

Figure 18:
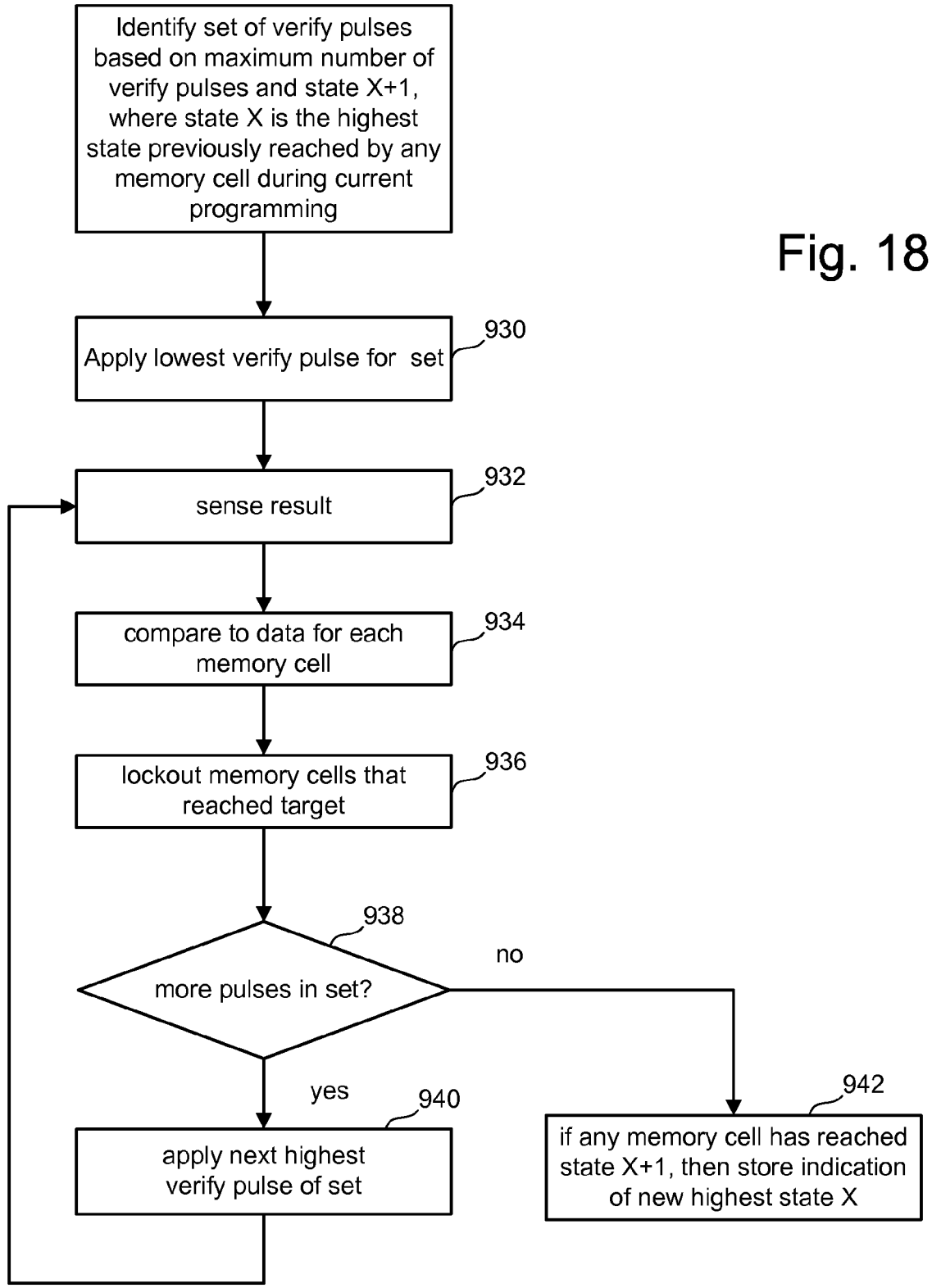
FIG. 18 is a flow chart describing one embodiment of a process for verifying.

FIG. 18 is one embodiment of a process for implementing step 842 of FIG. 15 when the process of FIG. 15 is being used to implement step 914 of FIG. 17. The process of FIG. 18 implements the concept that no more than a finite set of pulses will be used to verify, where that finite set is (probably) less than the full set. With respect to the example described above in regard to FIG. 17, no more than 8 verify pulses will be used between program pulses rather than all 15 verify pulses. However, the set of 8 verify pulses that are applied changes over time based on the natural threshold voltage distribution of the memory cells and the current state of the programming process. Once the system knows the width of the natural threshold voltage distribution of the memory cells, it is estimates where that natural threshold voltage distribution is along the graph of FIG. 6.

Step 910 of FIG. 17 calculated a maximum number of verify pulses. This determines the maximum width of the set of verify pulses. For example, if the maximum number of verify pulses is 8, then the set of verify pulses contemplated in FIG. 18 includes up to 8 verify pulses. As the programming process continues (through the various iterations of FIG. 15), the set of verify pulses will move so that different verify pulses become part of that set. For example, the set may start out only including a verify pulse for data state 0. Eventually the set will be augmented so that it includes verify pulses for data state 0 through data state 7, followed by the set moving so that it includes verify pulses for data states 1 through 8, then data states 2 through 9, and so on.

In step 928 of FIG. 18, the set of verify is identified based on the maximum number of verify pulses and based on the highest data state to be reached by any memory cell in the current programming process. In FIG. 18, the highest data state to be reached by any memory cell is referred to as state X. The set of verify pulses will include the verify pulses to needed to verify the state that is one state higher than the highest data state to be reached and verify pulses for the states below that state, but no more than the already determined maximum number of verify pulses. In FIG. 18, the state that is one state higher than the highest data state to be reached is referred to as state X+1. For example, if the programming process is just starting out, the highest data state to be reached may be state E, so the set of verify pulses would only include a verify pulse for state 0. If the memory cells have only reached state 5 and the already determined maximum number of verify pulses is 8, then the set of verify pulses would include verify pulses for states 0-6. If the programming process is significantly underway, memory cells have already reached state 7, and the already determined maximum number of verify pulses is 8, then the set of verify pulses would include verify pulses for states 8-1. If the memory cells have already reached state 10 and the already determined maximum number of verify pulses is 8, then the set of verify pulses would include verify pulses for states 4-11. If the memory cells have already reached state 13 and the already determined maximum number of verify pulses is 8, then the set of verify pulses would include verify pulses for states 7-14.

In step 930, the lowest verify pulse of the set of verify pulses identified in step 928 is applied to the selected word line. The magnitude of that one pulse is set as the verify level for the corresponding data state. In some embodiments, the verify level for a data state is equal to the lowest threshold voltage for that data state (see e.g., Vv1 for state 1, of FIG. 6). In step 932, the results of the program pulse are sensed. That is, it is determined whether the memory cell (or cells) of interest turned on or did not turn on. In step 934, the sensing result is compared to the data for each memory cell. If the memory cell is to be programmed to the target level just verified and it has reached that level, then in step 936, the memory cell is locked out by raising its bit line voltage. In step 938, it is determined were there anymore verify pulses within the set of verify pulses that have not yet been applied. If not, then in step 942 it is determined whether any of the memory cells have reached state X+1. If so, then the indication of the highest state (state X) is updated and the process of FIG. 18 is complete (also completing step 842 at FIG. 15). If there are more verify pulses for the set of verify pulses that have not yet been applied (step 938), then the next highest verify pulse is applied in step 940, and the process loops back to step 932. For example, when the set of verify pulses identified in step 928 includes verify pulses for states 2-10, the loop of FIG. 18 (step 932-938) will be performed 8 times.

After programming data, shifts in the apparent charge stored on a floating gate can occur because of coupling of an electric field based on the charge stored in the adjacent floating gates. This floating gate to floating gate coupling phenomena is described in U.S. Pat. No. 5,867,429, which is incorporated herein by reference in its entirety. A floating gate that to a target floating gate may include neighboring floating gates that are on the same bit line, neighboring floating gates that are on the same word line, or floating gates that are diagonal from the target floating gate because they are both on a neighboring bit line and a neighboring word line.

The floating gate to floating gate coupling phenomena occurs most pronouncedly between sets of adjacent memory cells that have been programmed at different times. For example, a first memory cell is programmed at a level of charge on its floating gate that corresponds to one set of data. Subsequently, one or more adjacent memory cells are programmed at a level of charge on their floating gates that correspond to a second set of data. After one or more of the adjacent memory cells are programmed, the charge level read from the first memory cell appears to be different than the programmed charge level because the effect of the charge on the adjacent memory cell is being coupled to the first memory cell. The coupling from the adjacent memory cells can shift the apparent charge level being read a sufficient amount to lead to an erroneous reading of the data stored.

One attempt to solve the problem of floating gate coupling is found in U.S. patent application Ser. No. 11/377,972, "System For Performing Read Operation On Non-Volatile Storage With Compensation For Coupling," filed on Mar. 17, 2006, by Nima Mokhlesi, incorporated herein by reference in its entirety. The system described in that application included applying compensation voltages to neighboring memory cells while reading a target memory cell.

Figure 19:
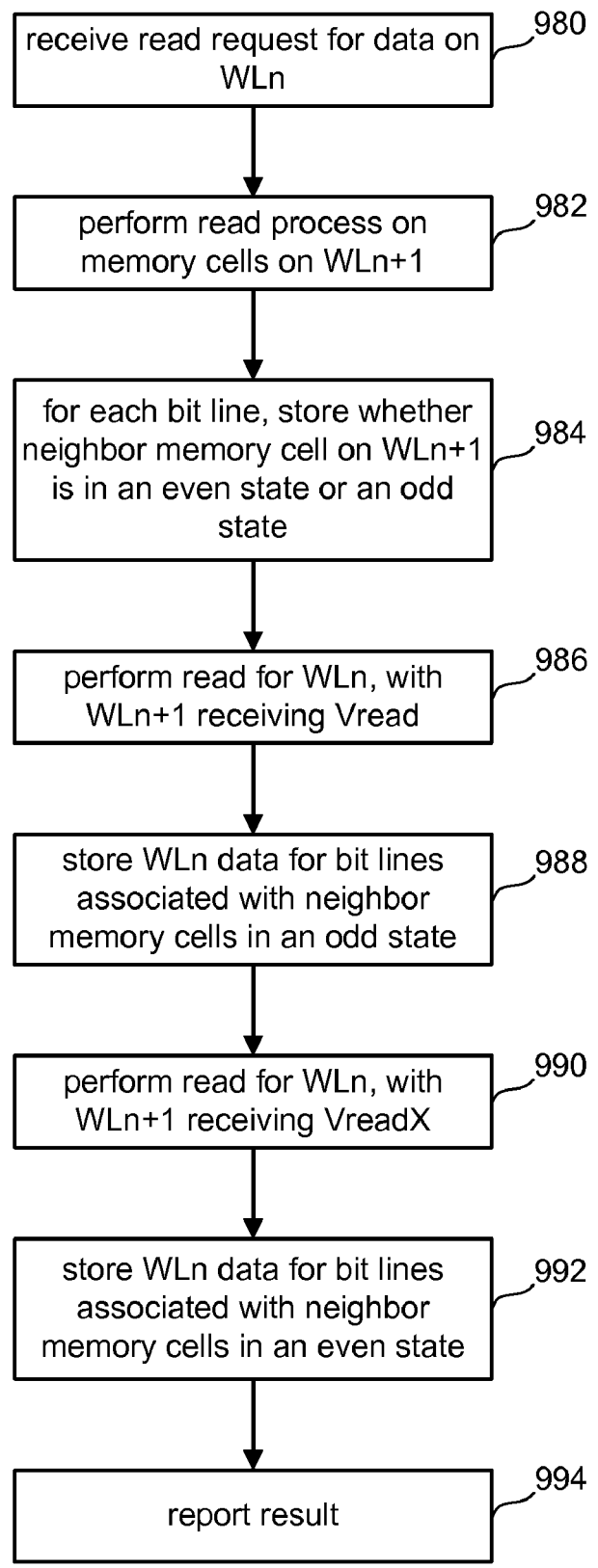
FIG. 19 is a flow chart describing one embodiment of a process for reading data.

FIG. 19 describes a process for limiting the effect of floating gate coupling when memory cells are programmed using the four pass programming technique described herein. During a typical read process, the memory cell of a NAND string that is selected to be read receives a voltage at its control gate equal to (or approximately equal to) a threshold voltage that is in between two neighboring data states. For example, to determine whether a memory cell is in data state 0, the control gate for the memory cell would receive Vr1 (see FIG. 6). To determine whether a memory cell is in state 1, two read operations would be performed: a first read operation would apply Vr1 to the memory cell and a second read operation would perform Vr2 to the memory cell (see FIG. 6). Depending on whether the memory cell turned on or off in response to the control gate voltages, logic is used to determine which state the memory cell is in.

Similarly, during a verify process, a verify compare voltage is applied to the control gate of the memory cell being verified. Typically that verify compare voltage would be similar to the lowest threshold voltage for the data state. For example, the verify voltage for the data state 1 would be Vv1. The verify voltage for data state 2 would be Vv2. When performing a read or verify process, the non-selected memory cells on an NAND string will receive a control gate voltage referred to as Vread that is significantly higher than the threshold voltages of data state 15. This voltage Vread (the overdrive voltage) will make sure that all the unselected memory cells will turn on and allow current to flow in the NAND string so that the current flow of the NAND string will be determined only by the targeted memory cell.

The process of FIG. 19 provides a way of reading memory cells that have been programmed using the four pass programming process described above in order to limit coupling from neighboring floating gates. The theory applied in the process of FIG. 18 is that during a read process the memory cell next to, and on the drain side of, the targeted memory cell on the same NAND string will sometimes receive a different voltage based on its data in order to compensate for floating gate coupling. For example, when reading a memory cell connected to WL12, the memory cell connected to WL13 will receive the different voltage. During the verify process, all of the memory cells except for the source-side neighboring memory cell will receive Vread, while the source-side neighboring memory cell will receive Vread less sum $\Delta$ (e.g., where $\Delta$ is 1 volt or another value depending on device characterization). This other value will be designated as VreadX, where VreadX=Vread−$\Delta$. During verify, all of the non-selected memory cells will receive Vread except the neighboring memory cell will receive VreadX. During a subsequent read process, if the source side neighboring memory cell is an even state (states 0, 2, 4, 6, 8, 10, 12, 14), then the source side neighboring memory cell will receive VreadX while all other non-selected memory cells will receive Vread. If, however, the source side neighbor memory cell is in an odd state (state 1, 3, 5, 7, 9, 11, 13, 15), then the neighboring memory cell will receive Vread during the read process. This causes the neighboring memory cell to receive compensation if it is an odd state.

Looking back at FIG. 11E, memory cells in an odd state were more heavily programmed from the respective intermediate state than memory cells in the even states. Thus, neighboring memory cells in an odd state will have greater coupling effect. If the four pass programming process is performed using the sequence of FIG. 13, then the fourth programming pass for a target memory cell was performed after the first three programming passes for its neighbor but before the fourth programming pass. Thus, only the fourth programming pass of the neighbor will cause floating gate to floating gate coupling on the target memory cell and binary (on/off or low/high) compensation needs to be used depending upon whether the fourth programming pass of the neighboring memory cell put that memory cell in an odd or even state.

Step 980 of FIG. 19 includes receiving a read request for data on a particular word line WLn. Thus WLn is the selected word line. In step 982, a read process is performed for all of the memory cells on the neighboring word line WLn+1. Step 982 includes determining what data state all of the memory cells connected to WLn+1 are in. For each bit line, an indication of whether the neighbor memory cell on WLn+1 is at an even state or an odd state is stored in step 984. This only requires one bit (odd/even) of storage for each bit line. For example, a one bit latch can be used. A read process is performed in step 986 for word line WLn. During the process of step 986, Vread is applied to WLn+1. Step 986 includes performing the compensation discussed above. In step 988, data from the read process of step 986 is stored for those bit lines associated with a neighbor memory cell in the odd state. For example, the system can check the one bit latch to see if it indicates a neighbor in an odd state and, if so, the results of step 986 are stored. Those bit lines having a neighboring memory cell in the even state will not store the date from the read process of step 986. In step 990, the read process is performed for word line WLn, with the neighbor word line WLn+1 receiving VreadX. In step 992, data for those bit lines having a neighbor memory cell in the even state will store the data from the read process of step 990. In step 994, the stored data (step 992 or step 988) will be reported.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage system, comprising:
a plurality of non-volatile storage elements; and
one or more managing circuits in communication with said plurality of non-volatile storage elements, said one or more managing circuits perform multiple programming processes for the plurality of non-volatile storage elements, each of said programming processes include said one or more managing circuits programming at least a subset of said non-volatile storage elements to a set of target conditions using program pulses, for at least a subset of said programming processes said one or more managing circuits identify a program pulse associated with achieving a particular result for a respective programming process and use said identified program pulse to adjust programming for a subsequent programming process for said non-volatile storage elements.

2. A non-volatile storage system according to claim 1, wherein:
said multiple programming processes include said one or more managing circuits performing four data programming passes that program data for one word line.

3. A non-volatile storage system according to claim 1, wherein:
said multiple programming processes include said one or more managing circuits performing a soft programming process and a data programming process.

4. A non-volatile storage system according to claim 1, wherein:
said particular result is a first non-volatile storage element reaching a predetermined target.

5. A non-volatile storage system according to claim 1, wherein:
said particular result is a set of N non-volatile storage elements reaching a predetermined target.

6. A non-volatile storage system according to claim 1, wherein:
said one or more managing circuits use said identified program pulse to adjust programming for a subsequent programming process by setting an initial magnitude of programming pulses for said subsequent programming process.

7. A non-volatile storage system according to claim 1, wherein:
said one or more managing circuits identify a program pulses associated with achieving a particular result by identifying a particular pulse that caused a set of one or more non-volatile storage elements to reach a predetermined target; and
said one or more managing circuits use said identified program pulse to adjust programming for a subsequent programming process by setting an initial magnitude of programming pulses for said subsequent programming process to be a same magnitude as said particular pulse.

8. A non-volatile storage system according to claim 1, wherein:
said multiple programming processes includes said one or more managing circuits performing a soft programming process and a data programming process;
said one or more managing circuits receive a request to program data; and
said request is received after one or more managing circuits perform said soft programming process and prior to one or more managing circuits perform said data programming process.

9. A non-volatile storage system according to claim 1, wherein:
said multiple programming processes include said one or more managing circuits performing a soft programming process and a data programming process; and
said one or more managing circuits stores information about said identified program pulse after said soft programming and access said stored information during said data programming process.

10. A non-volatile storage system according to claim 1, wherein:
said multiple programming processes includes said one or more managing circuits performing a soft programming process and a data programming process; and
said one or more managing circuits stores information about said identified program pulse based on and after said soft programming, said one or more managing circuits perform other programming processes subsequent to said soft programming and prior to said data programming process, said one or more managing circuits access said stored information during said data programming process.

11. A non-volatile storage system according to claim 1, wherein:
said multiple programming processes includes four programming passes; and
during at least one of said programming passes: said one or more managing circuits read an identification of a programming pulse from previous programming, set an initial magnitude for a programming signal based on said identification of said programming pulse from previous programming and apply said programming signal.

12. A non-volatile storage system according to claim 1, wherein:
said multiple programming processes includes four programming passes; and
during at least one of said programming passes: said one or more managing circuits read an identification of a programming pulse from previous programming, set an initial magnitude for a programming signal based on said identification of said programming pulse from previous programming, apply said programming signal, and store a new identification of a programming pulse for a subsequent programming pass if a predetermined number of non-volatile storage elements have reached a particular target.

13. A non-volatile storage system according to claim 1, wherein:
said non-volatile storage elements are multi-state NAND flash memory devices.

14. A non-volatile storage system according to claim 1, wherein:
said one or more managing circuits include any one or a combination of a controller, a state machine, control circuitry, power control circuitry, decoders, sense circuits, and read/write circuits.

15. A non-volatile storage system, comprising:
a plurality of non-volatile storage elements having control gates;
a word line connected to said control gates for all of said plurality of non-volatile storage elements;

a plurality of bit lines, each bit line connected to one of said plurality of non-volatile storage elements;

one or more managing circuits in communication with said word line and said bit line, said one or more managing circuits operate said plurality of non-volatile storage elements via said word line and said bit lines, said one or more managing circuits perform multiple programming passes for a plurality of non-volatile storage elements, each of said programming passes include said one or more managing circuits programming at least a subset of said non-volatile storage elements to a set of target conditions using program pulses, for at least a subset of said programming passes said one or more managing circuits identify a program pulse at which a predetermined number of one or more non-volatile storage elements reach a target threshold voltage and set an initial magnitude for program pulses used in a subsequent programming pass based on said identified program pulse.

16. A non-volatile storage system, comprising:

a plurality of non-volatile storage elements; and one or more managing circuits in communication with said plurality of non-volatile storage elements, said one or more managing circuits perform a first programming process for the plurality of non-volatile storage elements that programs at least a subset of said non-volatile storage elements to a first set of one or more target conditions using a set of program pulses, said one or more managing circuits identify a program pulse of said first programming process at which a predetermined number of one or more non-volatile storage elements reach said first set of one or more target conditions, said one or more managing circuits perform a second programming process for said plurality of non-volatile storage elements that programs at least some of said non-volatile storage elements to a second set of one or more targets using a program pulse signal that has an initial magnitude based on said identified program pulse.

17. A non-volatile storage system according to claim 16, wherein:

said first programming process is a soft programming process that is performed with an erase operation;

said second programming process is a data programming process;

said one or more managing circuits store information about said identified program pulse in a non-volatile storage device; and said one or more managing circuits read said information about said identified program pulse from said non-volatile storage device during said second programming process and after performing intervening operations between said first programming process and said second programming process.

18. A non-volatile storage system according to claim 16, wherein:

said first programming process and said second programming process are data programming processes that include said one or more managing circuits programming different pages of data in said non-volatile storage elements.

19. A non-volatile storage system, comprising:

a plurality of non-volatile storage elements; and one or more managing circuits in communication with said plurality of non-volatile storage elements, said one or more managing circuits erase said non-volatile storage elements, said one or more managing circuits soft program said non-volatile storage elements using a set of program pulses, said one or more managing circuits identify a program pulse for which a predetermined number of said non-volatile storage elements complete said soft programming and adjust a data programming process based on said identified program pulses, said one or more managing circuits program a first subset of said non-volatile storage elements using said adjusted data programming process.

20. A non-volatile storage system according to claim 19, wherein:

said one or more managing circuits adjust said data programming process by setting a magnitude of an initial program pulse for said data programming process.

21. A non-volatile storage system according to claim 19, wherein:

said plurality of non-volatile storage elements are a block of NAND flash memory cells; and said first subset of said non-volatile storage elements are connected to a common word line.

22. A non-volatile storage system according to claim 19, wherein:

said data programming process is a multi-pass programming process.

* * * * *